US012543559B2

(12) United States Patent
Greenlee et al.

(10) Patent No.: US 12,543,559 B2
(45) Date of Patent: Feb. 3, 2026

(54) MEMORY DEVICE INCLUDING CONTROL GATES HAVING TUNGSTEN STRUCTURE

(71) Applicant: Micron Technology, Inc., Boise, ID (US)

(72) Inventors: Jordan D. Greenlee, Boise, ID (US); Rita J. Klein, Boise, ID (US); Everett Allen McTeer, Eagle, ID (US); John Hopkins, Meridian, ID (US); David Ross Economy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 883 days.

(21) Appl. No.: 17/216,210

(22) Filed: Mar. 29, 2021

(65) Prior Publication Data

US 2022/0310524 A1    Sep. 29, 2022

(51) Int. Cl.
*H01L 23/532*    (2006.01)
*H01L 21/768*    (2006.01)
(Continued)

(52) U.S. Cl.
CPC .. *H01L 23/53257* (2013.01); *H01L 21/76805* (2013.01); *H01L 21/76895* (2013.01);
(Continued)

(58) Field of Classification Search
CPC ............. H01L 23/535; H01L 21/76895; H01L 21/76805; H01L 23/53257; H10B 43/27; H10B 41/27
See application file for complete search history.

(56) References Cited

U.S. PATENT DOCUMENTS

| | | |
|---|---|---|
| 6,110,826 A | 8/2000 | Lou et al. |
| 6,310,300 B1 | 10/2001 | Cooney, III et al. |

(Continued)

FOREIGN PATENT DOCUMENTS

| | | |
|---|---|---|
| CN | 105917446 A | 8/2016 |
| CN | 110235247 | 9/2019 |

(Continued)

OTHER PUBLICATIONS

U.S. Appl. No. 16/235,765 U.S. Pat. No. 10,847,367, filed Dec. 28, 2018, Methods of Forming Tungsten Structures.

(Continued)

*Primary Examiner* — Ratisha Mehta
*Assistant Examiner* — Mikka Liu
(74) *Attorney, Agent, or Firm* — Schwegman Lundberg & Woessner, P.A.

(57) ABSTRACT

Some embodiments include apparatuses and methods of forming the apparatuses. One of the apparatuses includes a first dielectric material; a second dielectric material separated from the first dielectric material; a memory cell string including a pillar extending through the first and second dielectric materials, the pillar including a portion between the first and second dielectric materials; an additional dielectric material contacting the portion of the pillar; a conductive material contacting the additional dielectric material; and a tungsten structure including a portion of tungsten contacting the conductive material, wherein a majority of the portion of tungsten is beta-phase tungsten.

25 Claims, 18 Drawing Sheets

(51) Int. Cl.
  *H01L 23/535* (2006.01)
  *H10B 41/27* (2023.01)
  *H10B 43/27* (2023.01)
(52) U.S. Cl.
  CPC ........... *H01L 23/535* (2013.01); *H10B 41/27* (2023.02); *H10B 43/27* (2023.02)

(56) References Cited

U.S. PATENT DOCUMENTS

| | | |
|---|---|---|
| 6,579,788 B1 | 6/2003 | Jones et al. |
| 6,734,097 B2 | 5/2004 | Iggulden et al. |
| 7,666,785 B2 | 2/2010 | Sung et al. |
| 7,830,016 B2 | 11/2010 | Meldrim et al. |
| 10,593,695 B1 | 3/2020 | Kim et al. |
| 10,847,367 B2 | 11/2020 | Economy et al. |
| 11,244,903 B2 | 2/2022 | Greenlee et al. |
| 11,646,206 B2 | 5/2023 | Economy et al. |
| 11,647,634 B2 | 5/2023 | Yang et al. |
| 11,791,268 B2 | 10/2023 | Greenlee et al. |
| 2002/0048938 A1 | 4/2002 | Ishizuka et al. |
| 2006/0063025 A1 | 3/2006 | Huang et al. |
| 2008/0089111 A1 | 4/2008 | Lee et al. |
| 2008/0237798 A1 | 10/2008 | Lee et al. |
| 2008/0247214 A1 | 10/2008 | Ufert |
| 2008/0248327 A1 | 10/2008 | Huang et al. |
| 2009/0142925 A1 | 6/2009 | Ha et al. |
| 2009/0149022 A1 | 6/2009 | Chan et al. |
| 2009/0321943 A1 | 12/2009 | Meldrim et al. |
| 2010/0207193 A1* | 8/2010 | Tanaka .................... H10B 43/27 257/E21.679 |
| 2011/0193049 A1* | 8/2011 | Iwakaji .................. H10B 63/20 257/E21.003 |
| 2014/0154883 A1 | 6/2014 | Humayun et al. |
| 2014/0167131 A1 | 6/2014 | Lu et al. |
| 2015/0008505 A1 | 1/2015 | Chien et al. |
| 2015/0028425 A1* | 1/2015 | Kim ........................ H10N 70/20 438/197 |
| 2015/0137315 A1* | 5/2015 | Chen ........................ H01L 28/82 257/532 |
| 2015/0171321 A1* | 6/2015 | Chan ................. H01L 23/53257 438/669 |
| 2015/0294906 A1 | 10/2015 | Wu et al. |
| 2016/0013200 A1 | 1/2016 | Yamashita |
| 2016/0149002 A1 | 5/2016 | Sharangpani et al. |
| 2016/0204343 A1* | 7/2016 | Gotti .................... H10N 70/245 257/4 |
| 2016/0233220 A1 | 8/2016 | Danek et al. |
| 2017/0213761 A1* | 7/2017 | Tang .................... H01L 29/861 |
| 2017/0358588 A1 | 12/2017 | Ando et al. |
| 2018/0076032 A1 | 3/2018 | Wang et al. |
| 2018/0166665 A1* | 6/2018 | Audebert ................. G02C 7/04 |
| 2018/0240807 A1* | 8/2018 | Yamashita ............. H10B 41/10 |
| 2019/0051661 A1 | 2/2019 | Carlson |
| 2019/0074289 A1 | 3/2019 | Hwang et al. |
| 2019/0296034 A1* | 9/2019 | Nagashima ....... H01L 21/76224 |
| 2020/0211843 A1 | 7/2020 | Economy et al. |
| 2020/0227318 A1* | 7/2020 | Kawasaki ......... H01L 21/76849 |
| 2021/0183651 A1 | 6/2021 | Economy et al. |
| 2021/0202388 A1 | 7/2021 | Greenlee et al. |
| 2021/0399019 A1 | 12/2021 | Cho et al. |

FOREIGN PATENT DOCUMENTS

| | | |
|---|---|---|
| CN | 110323225 | 10/2019 |
| CN | 111106118 | 5/2020 |
| CN | 111149205 | 5/2020 |
| CN | 112397524 | 2/2021 |
| CN | 113130387 A | 7/2021 |
| CN | 113130387 B | 1/2023 |
| CN | 117178647 A | 12/2023 |
| EP | 1094504 A2 | 4/2001 |
| KR | 100705936 B1 | 4/2007 |
| KR | 20170028872 A | 3/2017 |
| TW | 202039906 A | 11/2020 |
| WO | WO-0104949 A1 | 1/2001 |
| WO | WO-2016085572 A1 | 6/2016 |
| WO | WO-2017052494 A1 | 3/2017 |
| WO | WO-2020139632 A1 | 7/2020 |

OTHER PUBLICATIONS

U.S. Appl. No. 17/101,950, filed Nov. 23, 2020, Methods of Forming Tungsten Structures.

U.S. Appl. No. 16/730,505 U.S. Pat. No. 11,244,903, filed Dec. 30, 2019, Tungsten Structures and Methods of Forming the Structures.

U.S. Appl. No. 17/666,093, filed Feb. 7, 2022, Tungsten Structures and Methods of Forming the Structures.

U.S. Appl. No. 17/216,264, filed Mar. 29, 2021, Memory Device Including Control Gates Having Tungsten Structure.

"Taiwanese Application Serial No. 111111883, Office Action mailed Jan. 7, 2023", with machine English translation, 23 pages.

"International Application Serial No. PCT/US2019/066919, International Preliminary Report on Patentability mailed Jul. 8, 2021", 9 pgs.

"International Application Serial No. PCT/US2019/066919, International Search Report mailed Apr. 22, 2020", 3 pgs.

"International Application Serial No. PCT/US2019/066919, Written Opinion mailed Apr. 22, 2020", 6 pgs.

"Chinese Application Serial No. 202011499891.1, Office Action mailed Apr. 15, 2022", W/ English Translation, 12 pgs.

"International Application Serial No. PCT/US2022/020361, International Search Report mailed Jul. 1, 2022", 3 pgs.

"International Application Serial No. PCT/US2022/020361, Written Opinion mailed Jul. 1, 2022", 5 pgs.

"International Application Serial No. PCT/US2022/020361, International Preliminary Report on Patentability mailed Oct. 12, 2023", 7 pgs.

U.S. Appl. No. 17/216,264, Response filed Mar. 5, 2024 to Non Final Office Action mailed Dec. 5, 2023, pages.

U.S. Appl. No. 17/216,264, Final Office Action mailed Mar. 27, 2024, 16 pgs.

U.S. Appl. No. 17/216,264, Response filed May 28, 2024 to Final Office Action mailed Mar. 27, 2024, 10 pages.

"Chinese Application Serial No. 202210323668.4, Office Action mailed Jan. 15, 2025", with English translation, 27 pages.

"Chinese Application Serial No. 202210323668.4, Response filed May 14, 2025 to Office Action mailed Jan. 15, 2025", with English claims, 19 pages.

* cited by examiner

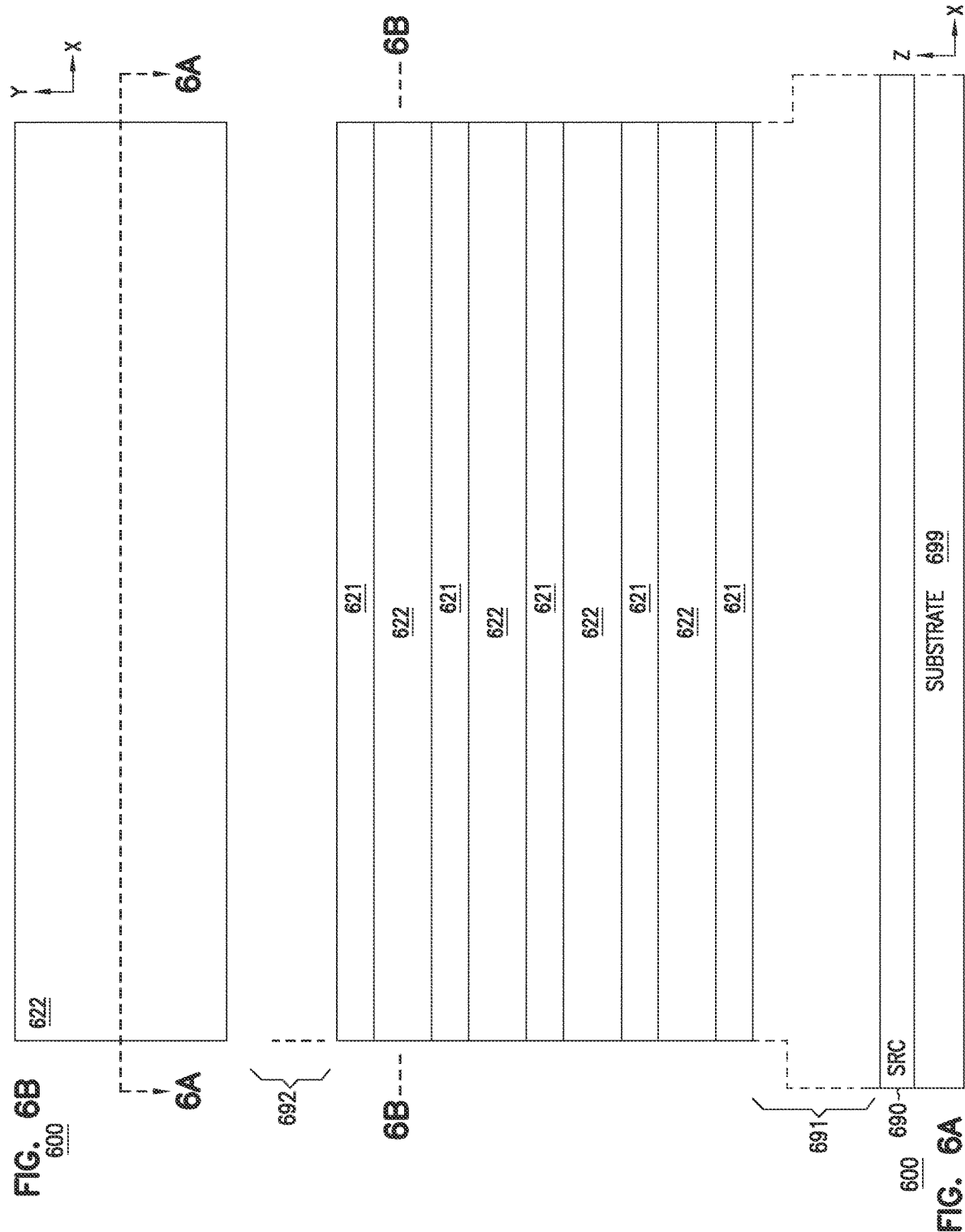

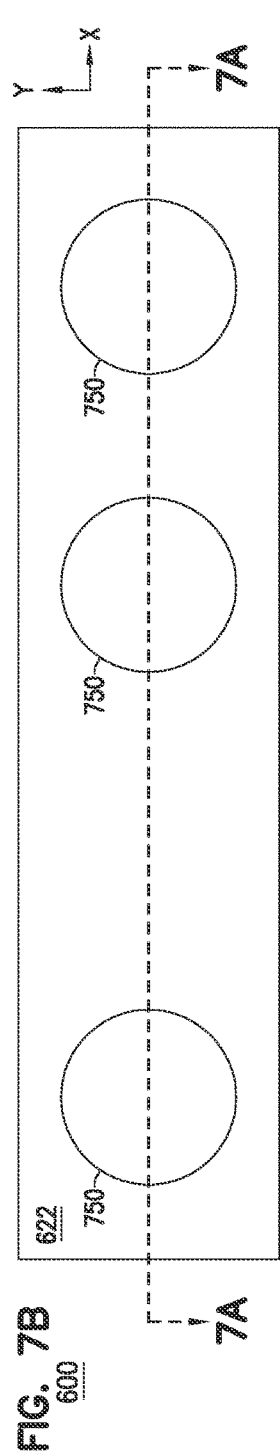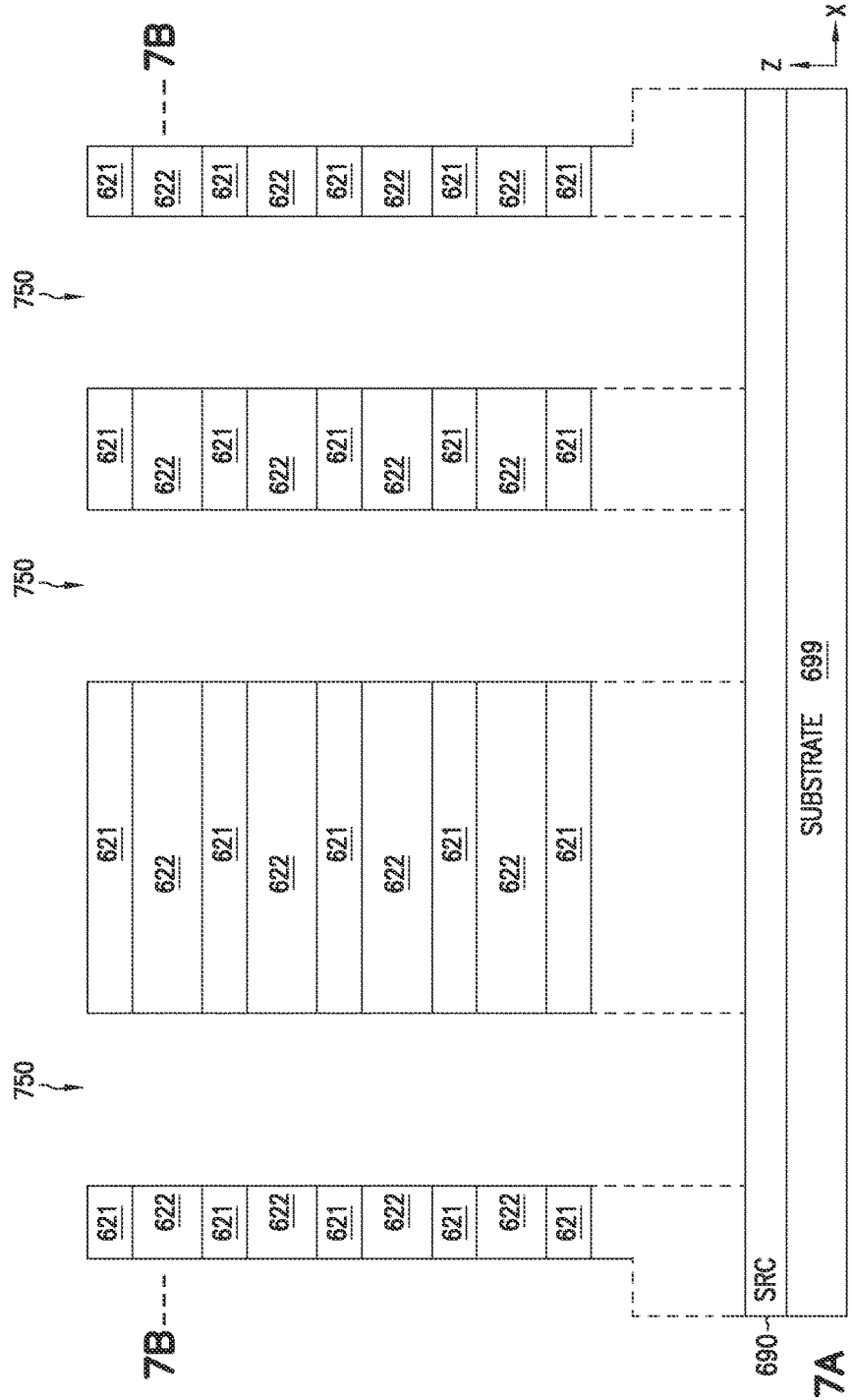

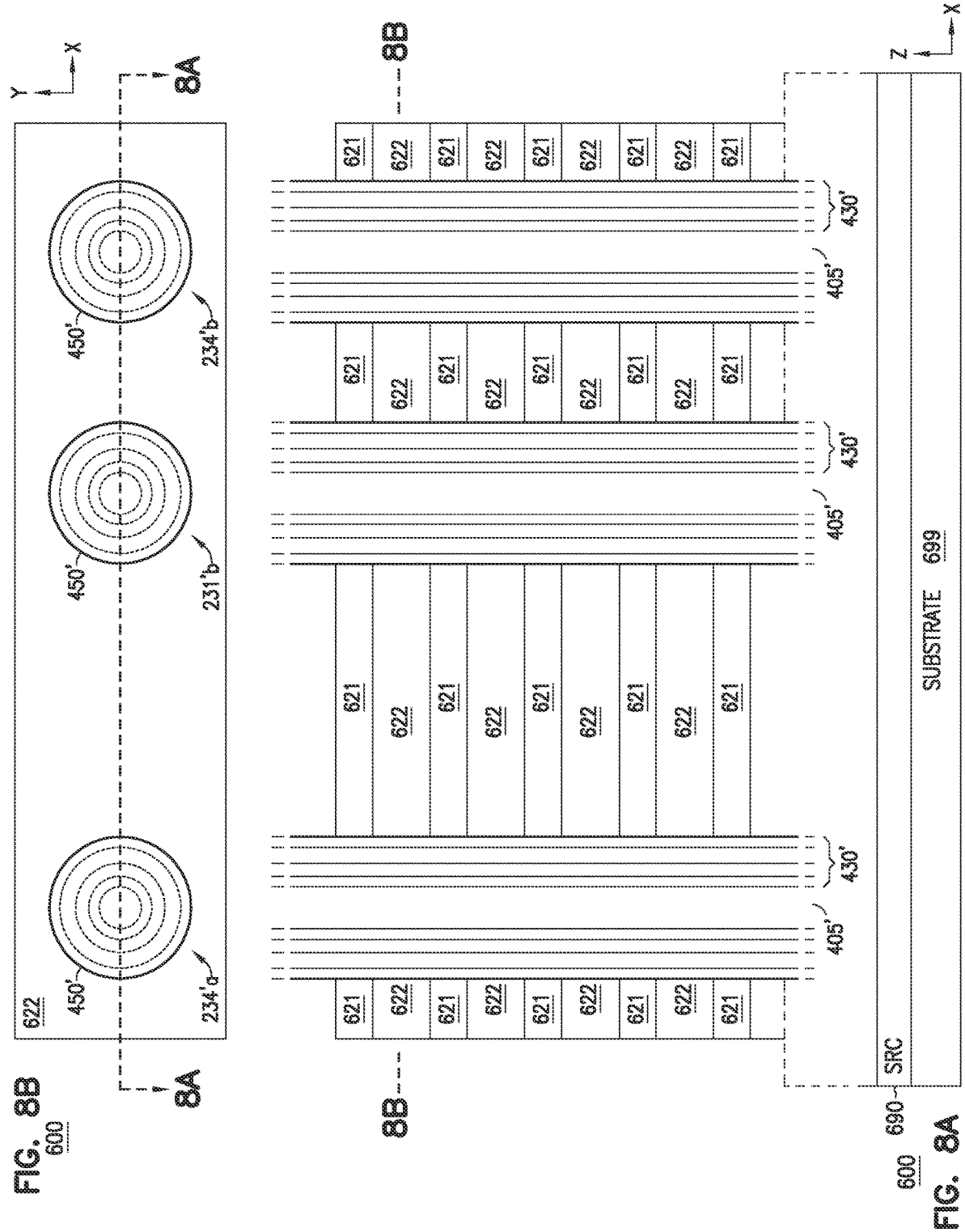

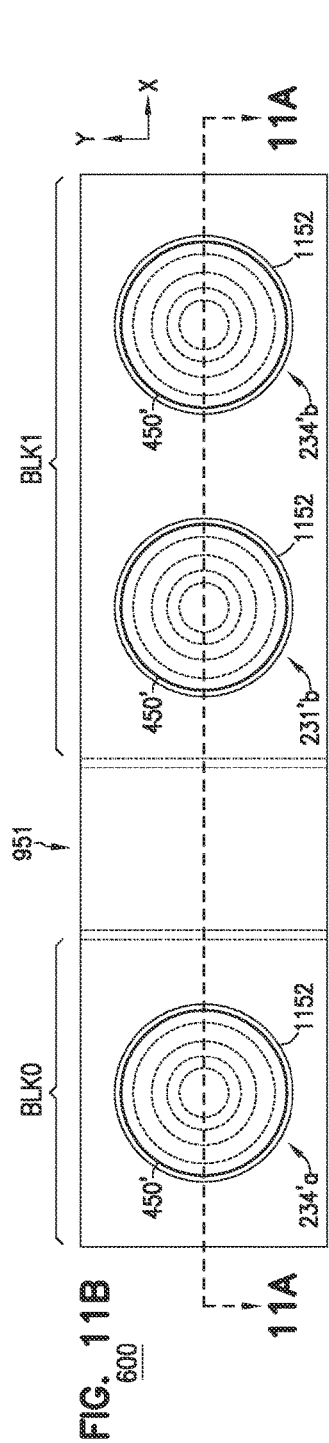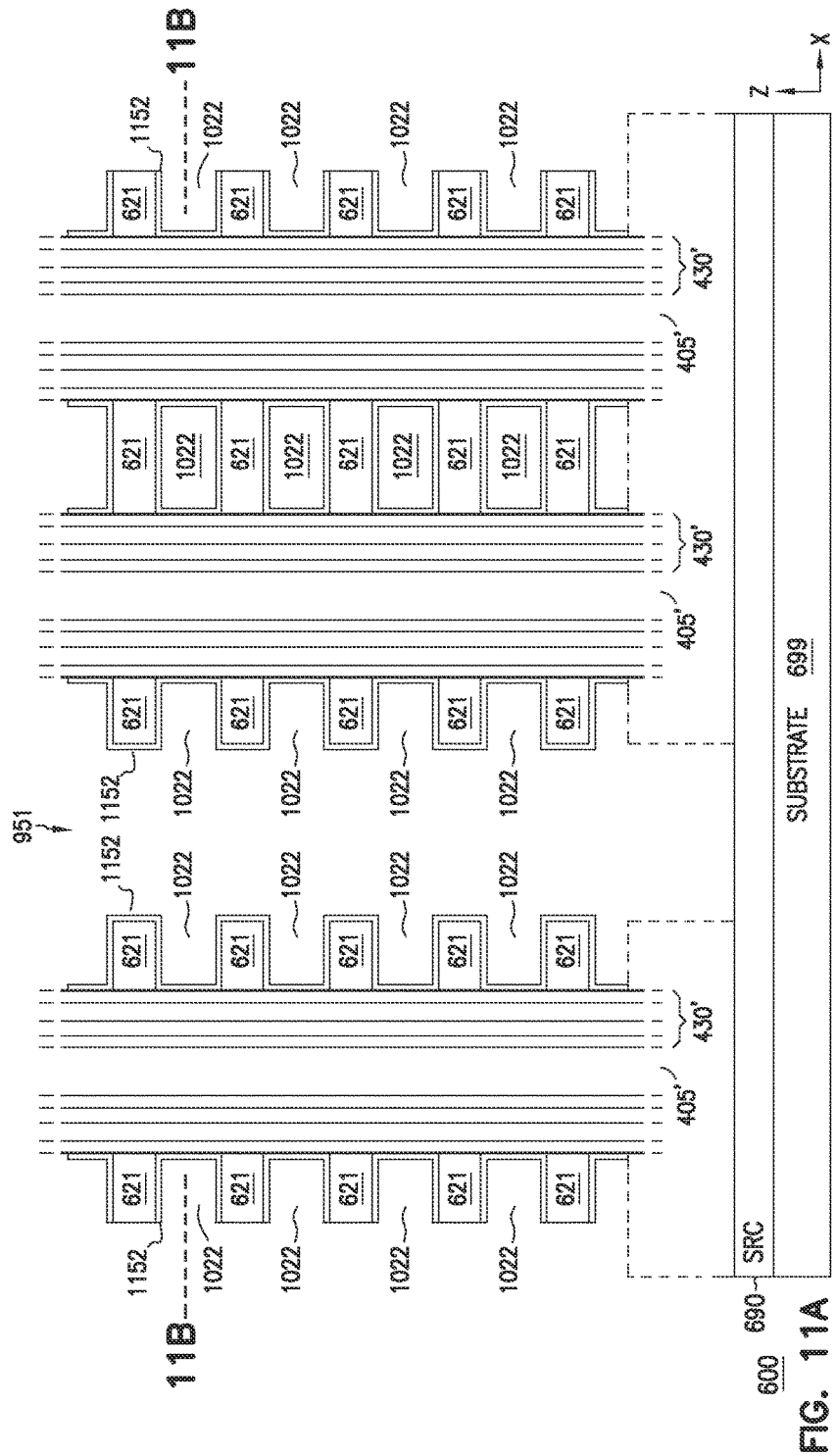

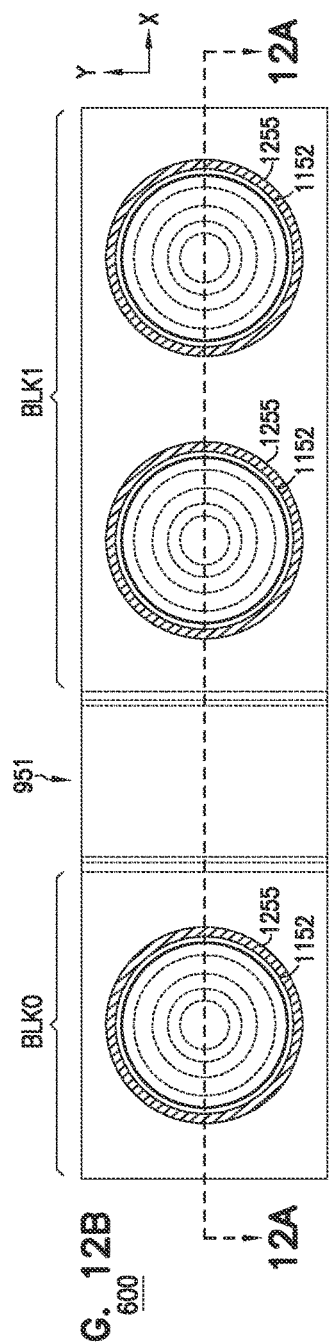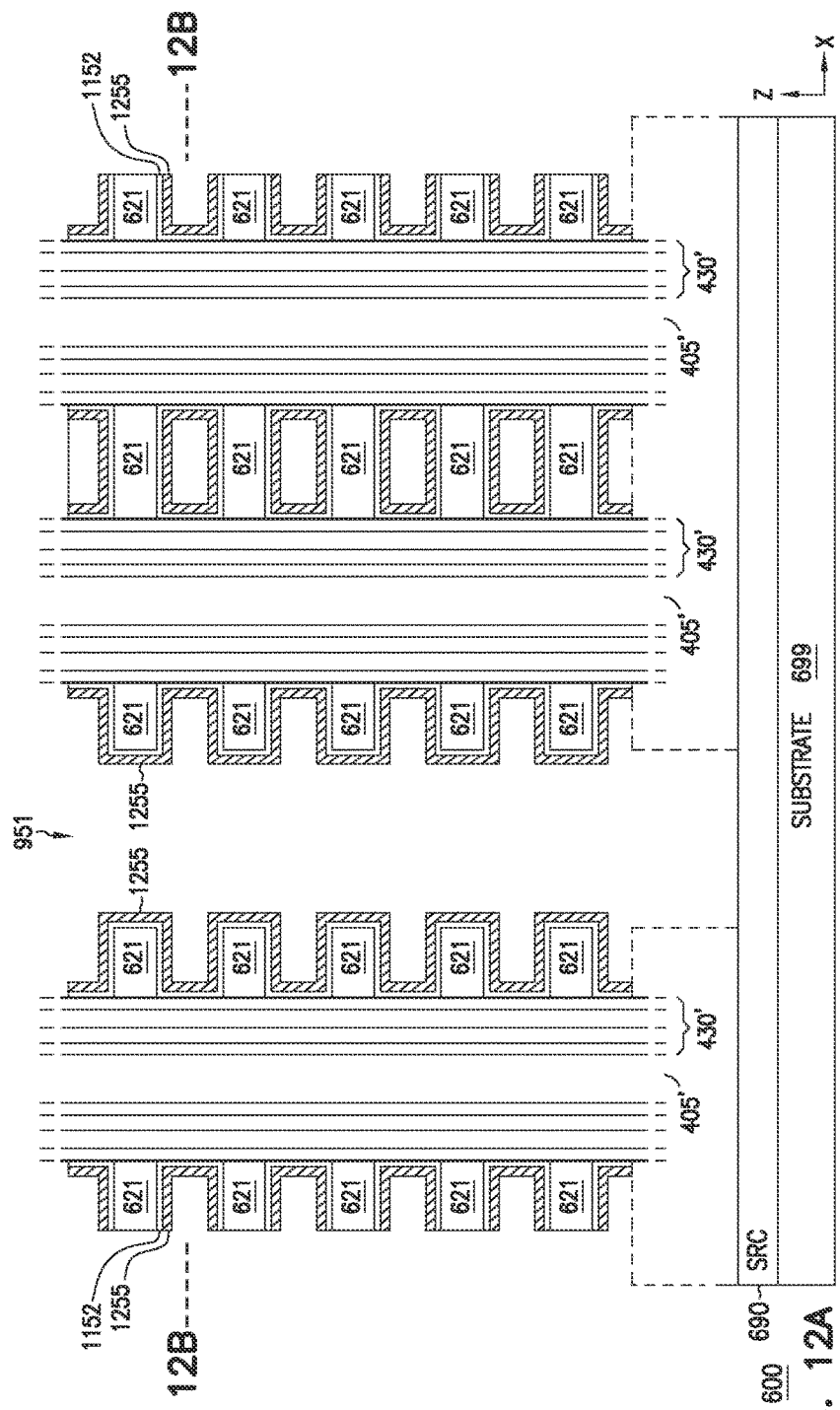

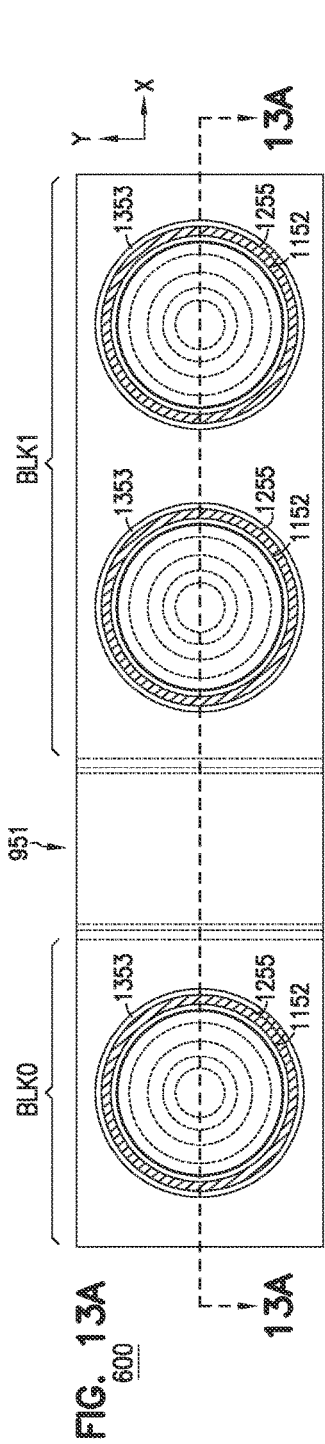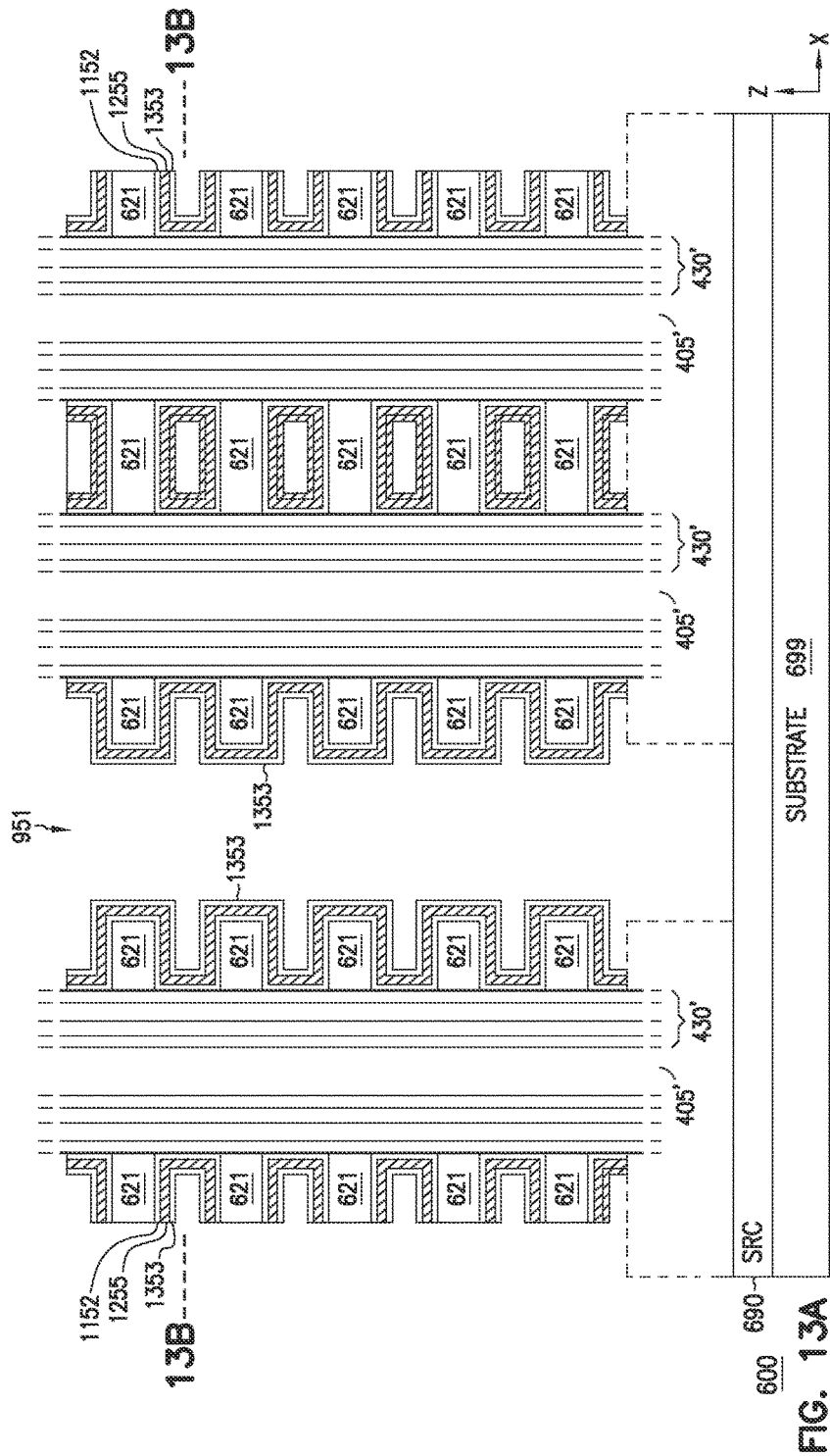

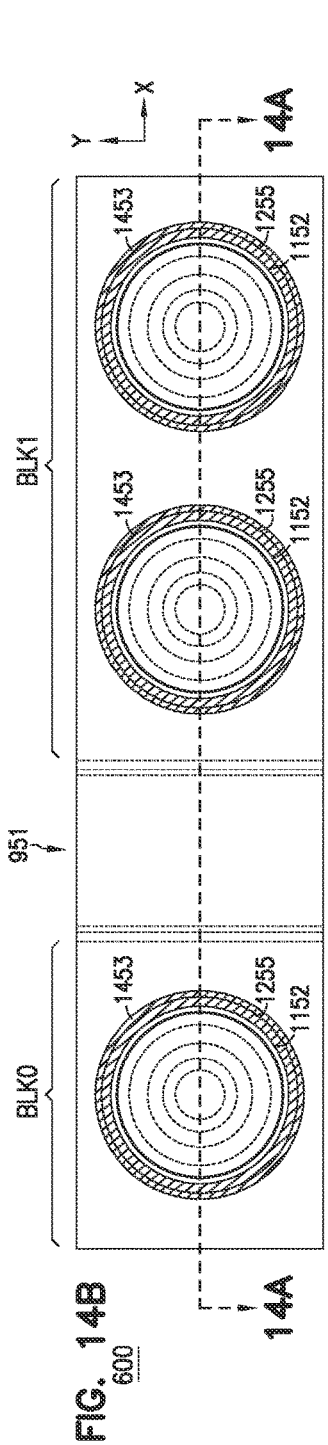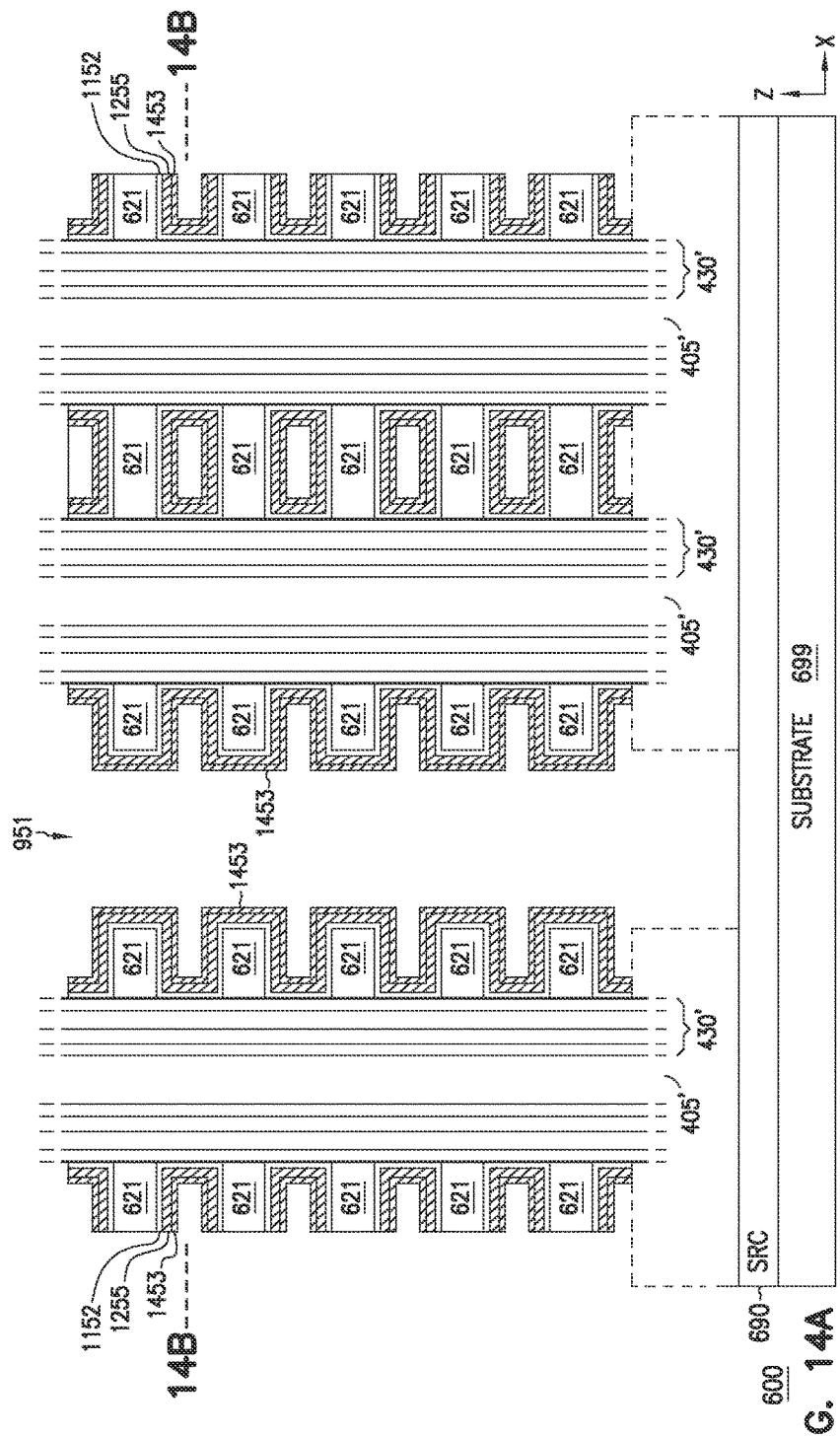

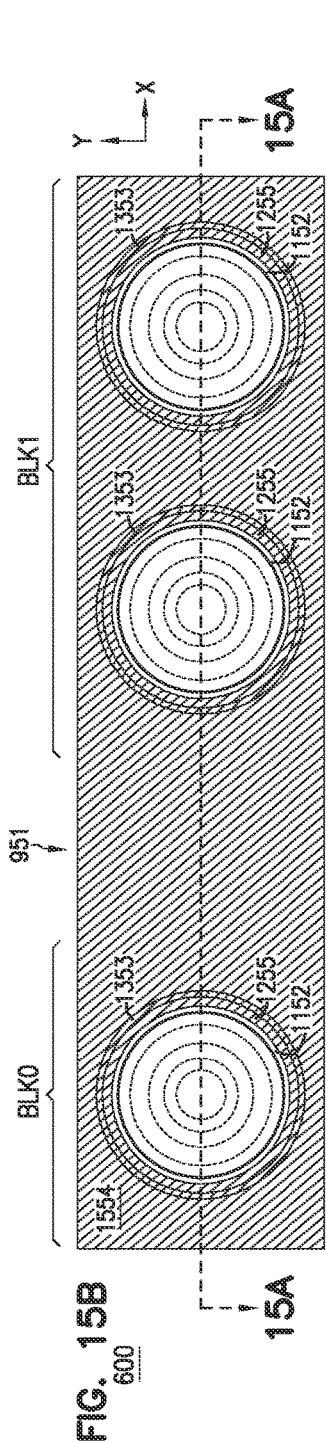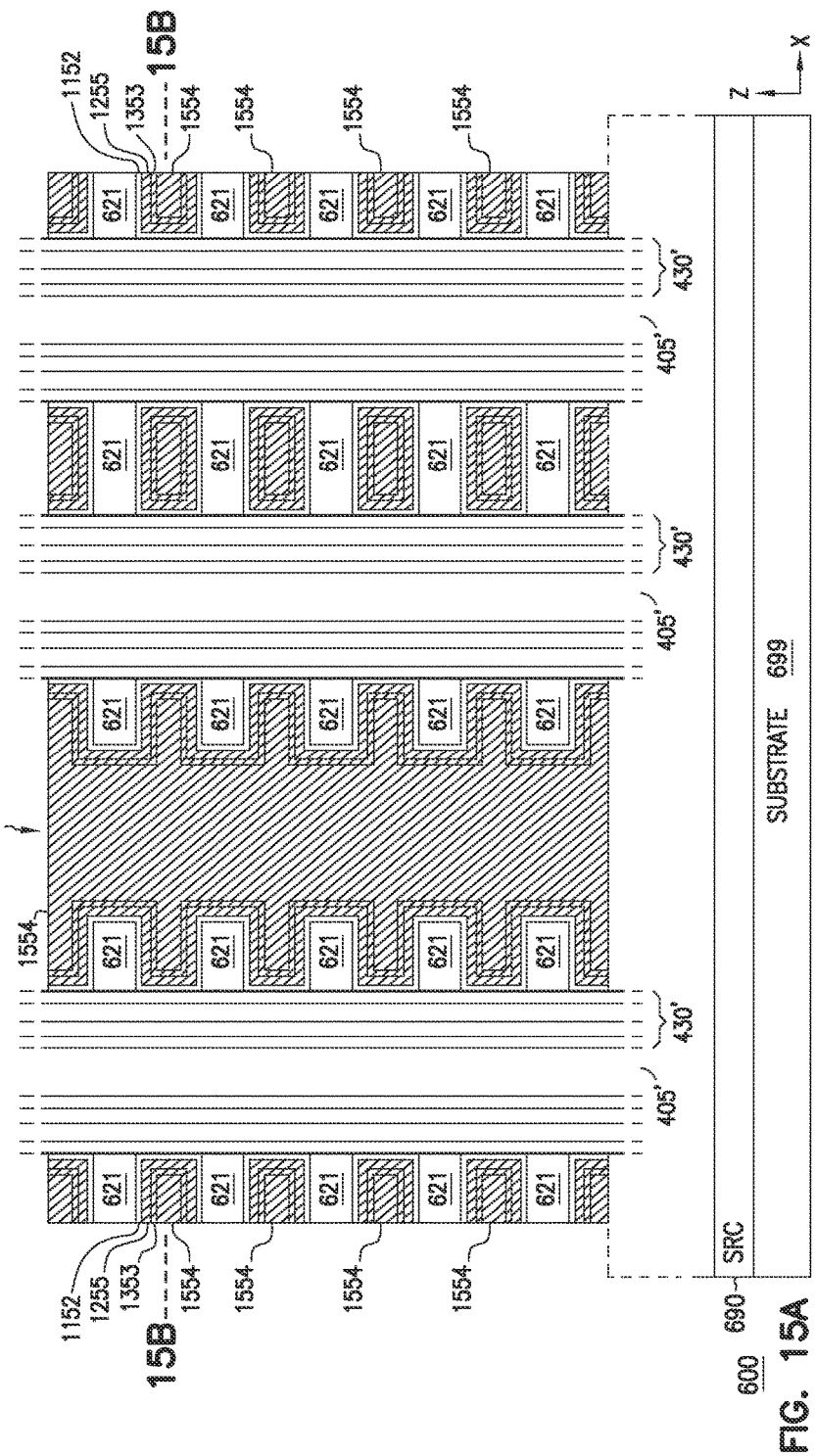

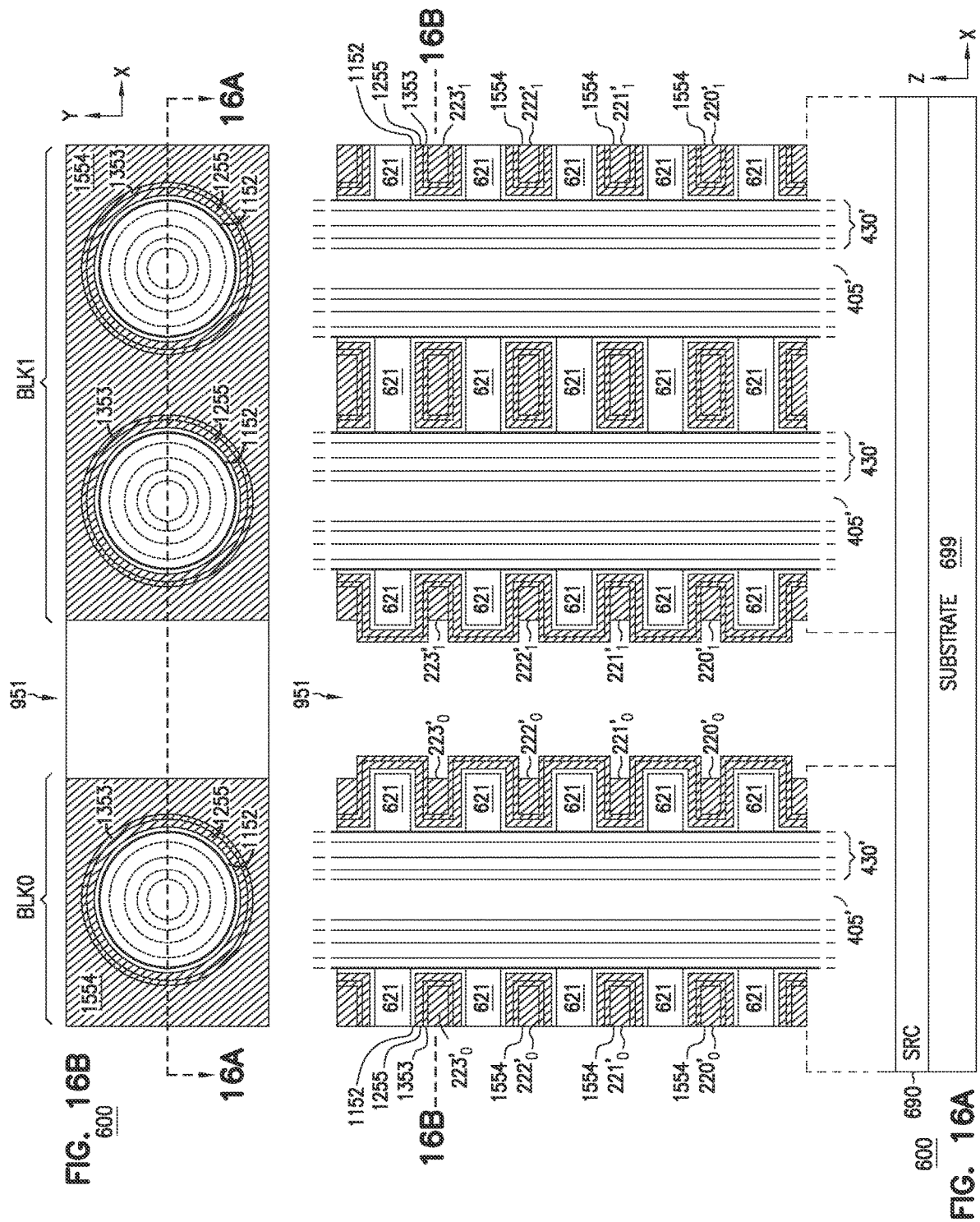

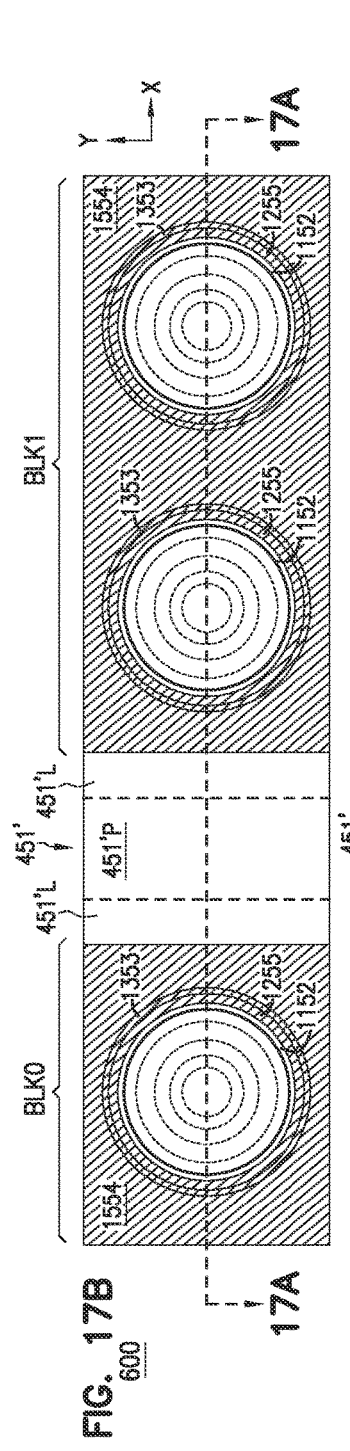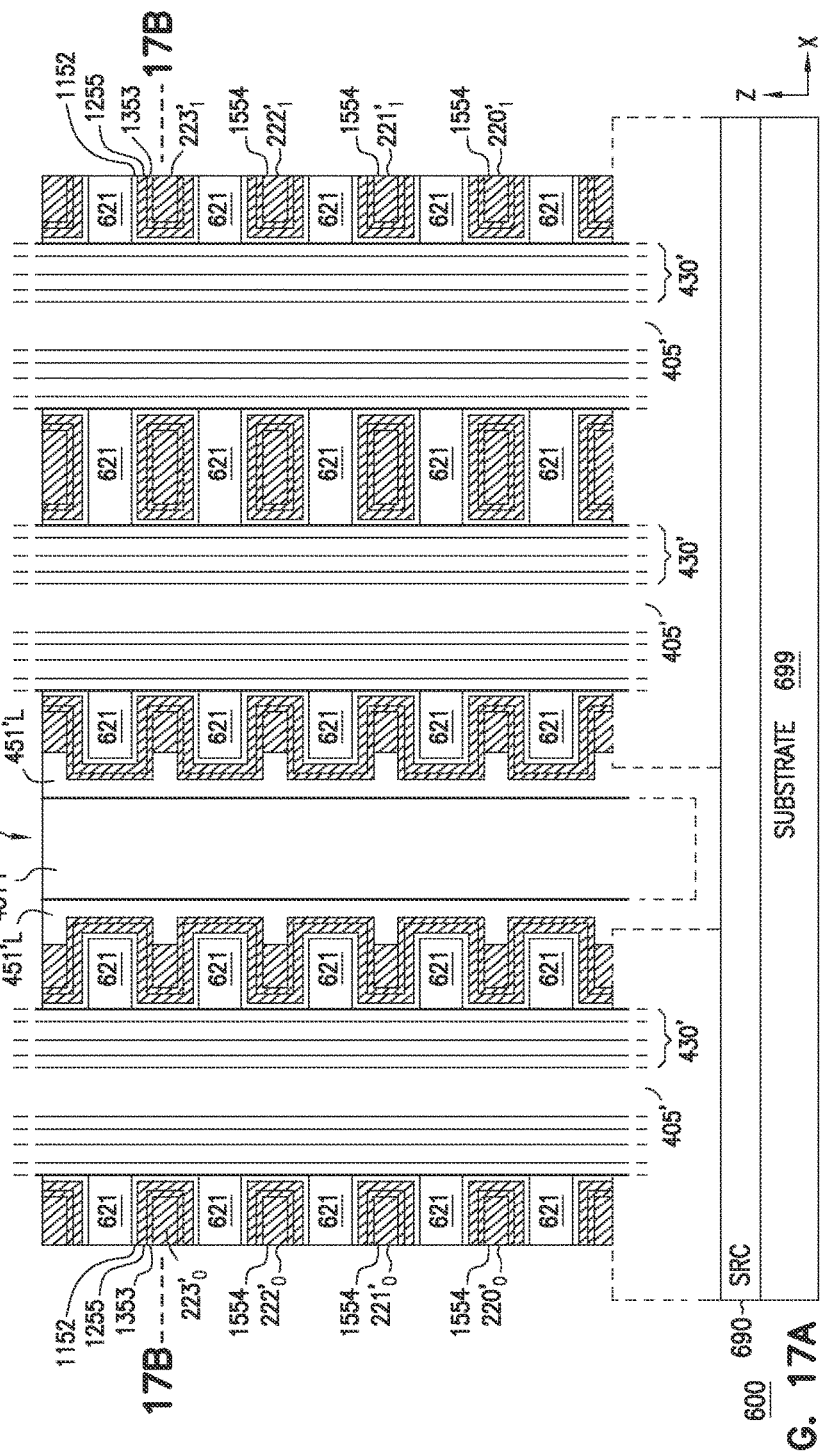

MEMORY DEVICE INCLUDING CONTROL GATES HAVING TUNGSTEN STRUCTURE

TECHNICAL FIELD

Embodiments described herein relate to memory devices including structures of control gates of memory devices.

BACKGROUND

Memory devices are widely used in computers and many other electronic items. A memory device usually has numerous memory cells used to store information (e.g., data) and control gates to control access to the memory cells during operations of the memory device. The resistance of the control gates can impact some operations of the memory device. The resistance of the control gates can be based on the structures of the control gates. In some conventional memory devices, structuring the control gates to achieve a balance or an optimal combination of device operations and control gate resistance can pose a challenge.

BRIEF DESCRIPTION OF THE DRAWINGS

FIG. 6A and FIG. 6B through FIG. 17A and FIG. 17B show different views of elements during processes of forming a memory device, according to some embodiments described herein.

DETAILED DESCRIPTION

The techniques described herein involve control gates of a memory device. The control gates can be used to control access to respective memory cells of memory cell strings to the memory device. Each of the control gates can include a tungsten structure. The tungsten structure can have a relatively low resistance to improve operation of the memory device. Improvements and benefits of the techniques described herein are further discussed below with reference to FIG. 1 through FIG. 16B.

Figure 1:
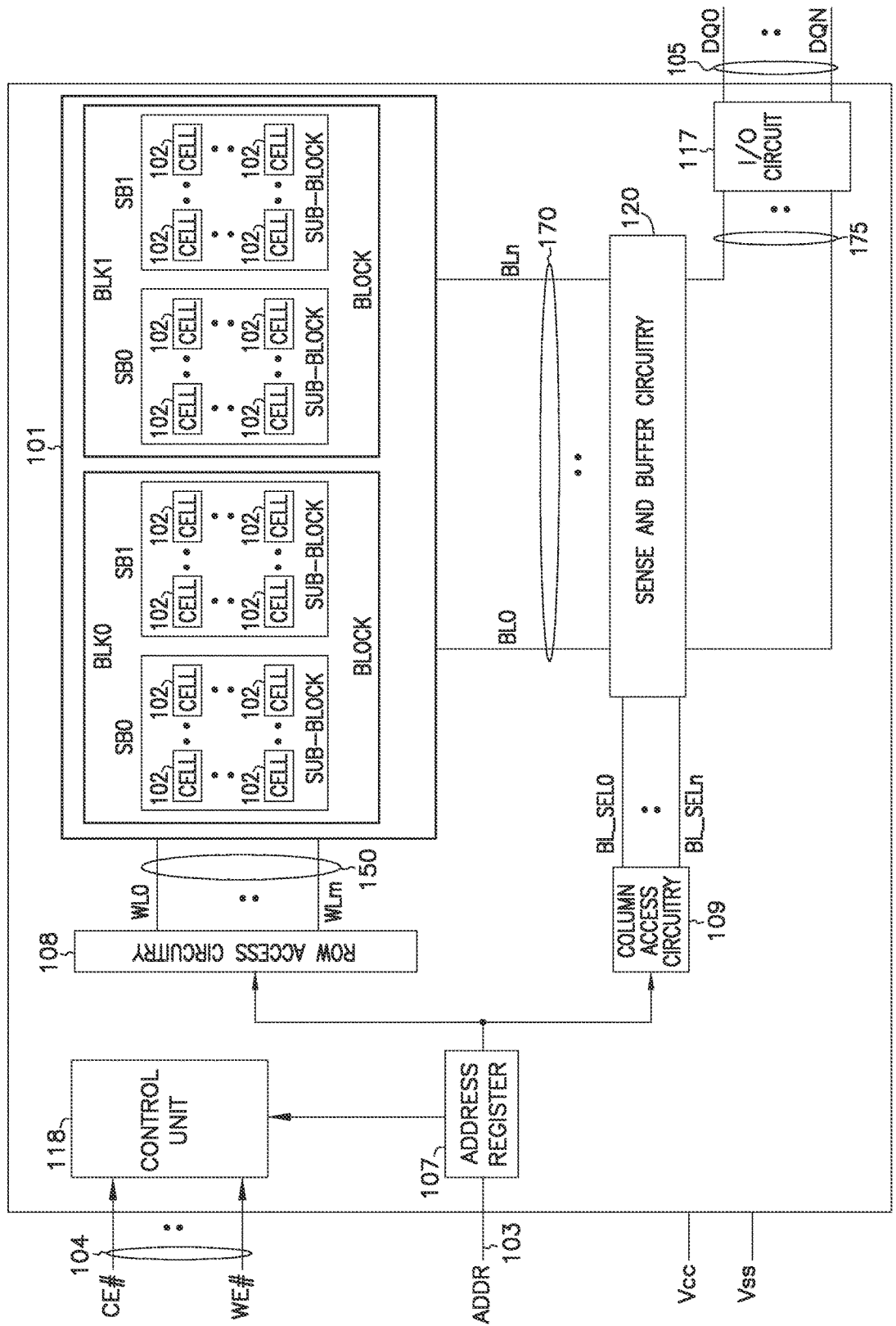
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a memory array (or multiple memory arrays) 101 containing memory cells 102 arranged in blocks (blocks of memory cells), such as blocks BLK0 and BLK1. Each of blocks BLK0 and BLK1 can include its own sub-blocks, such as sub-blocks SB0 and SB1. In the physical structure of memory device 100, memory cells 102 can be arranged vertically (e.g., stacked over each other) over a substrate (e.g., a semiconductor substrate) of memory device 100. FIG. 1 shows memory device 100 having two blocks BLK0 and BLK1 and two sub-blocks in each of the blocks as an example. Memory device 100 can have more than two blocks and more than two sub-blocks in each of the blocks.

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 of blocks BLK0 and BLK1 and data lines 170 to selectively exchange information (e.g., data) with memory cells 102 of blocks BLK0 and BLK1. Block BLK0 can have access lines (e.g., word lines) that are electrically separated from access lines (e.g., word lines) of block BLK1. Sub-blocks of the same block can share access lines (e.g., can share word lines) and can be controlled by the same access lines. For example, sub-blocks SB0 and SB1 of block BLK0 can share a group of access lines associated with block BLK0, and sub-blocks SB0 and SB1 of block BLK1 can share another group of access lines associated with block BLK1.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which sub-blocks of blocks BLK0 and BLK1 are to be accessed during a memory operation. Memory device 100 can perform a read operation to read (e.g., sense) information (e.g., previously stored information) from memory cells 102 of blocks BLK0 and BLK1, or a write (e.g., programming) operation to store (e.g., program) information in memory cells 102 of blocks BLK0 and BLK1. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks BLK0 and BLK1.

Memory device 100 can include a control unit 118 that can be configured to control memory operations of memory device 100 based on control signals on lines 104. Examples of the control signals on lines 104 include one or more clock signals and other signals (e.g., a chip enable signal CE #, a write enable signal #) to indicate which operation (e.g., read, write, or erase operation) memory device 100 can perform. Other devices external to memory device 100 (e.g., a memory controller or a processor) may control the values of the control signals on lines 104. Specific values of a combination of the signals on lines 104 may produce a command (e.g., read, write, or erase command) that causes memory device 100 to perform a corresponding memory operation (e.g., read, write, or erase operation).

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks BLK0 and BLK1 and provide the value of the information to lines (e.g., global data lines) 175. Sense and buffer circuitry 120 can also be configured to use signals on lines 175 to determine the value of information to be stored (e.g., programmed) in memory cells 102 of blocks BLK0 and BLK1 (e.g., during a write operation) based on the values (e.g., voltage values) of signals on lines 175 (e.g., during a write operation).

Memory device 100 can include input/output (I/O) circuitry 117 to exchange information between memory cells 102 of blocks BLK0 and BLK1 and lines (e.g., I/O lines) 105. Signals DQ0 through DQN on lines 105 can represent information read from or stored in memory cells 102 of blocks BLK0 and BLK1. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits (e.g., more than three bits in each memory cell). A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3D NAND) or a NOR flash memory device, or another kind of memory device, such as a variable resistance memory device (e.g., a phase change memory device or a resistive Random Access Memory (RAM) device).

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 16B.

Figure 2:
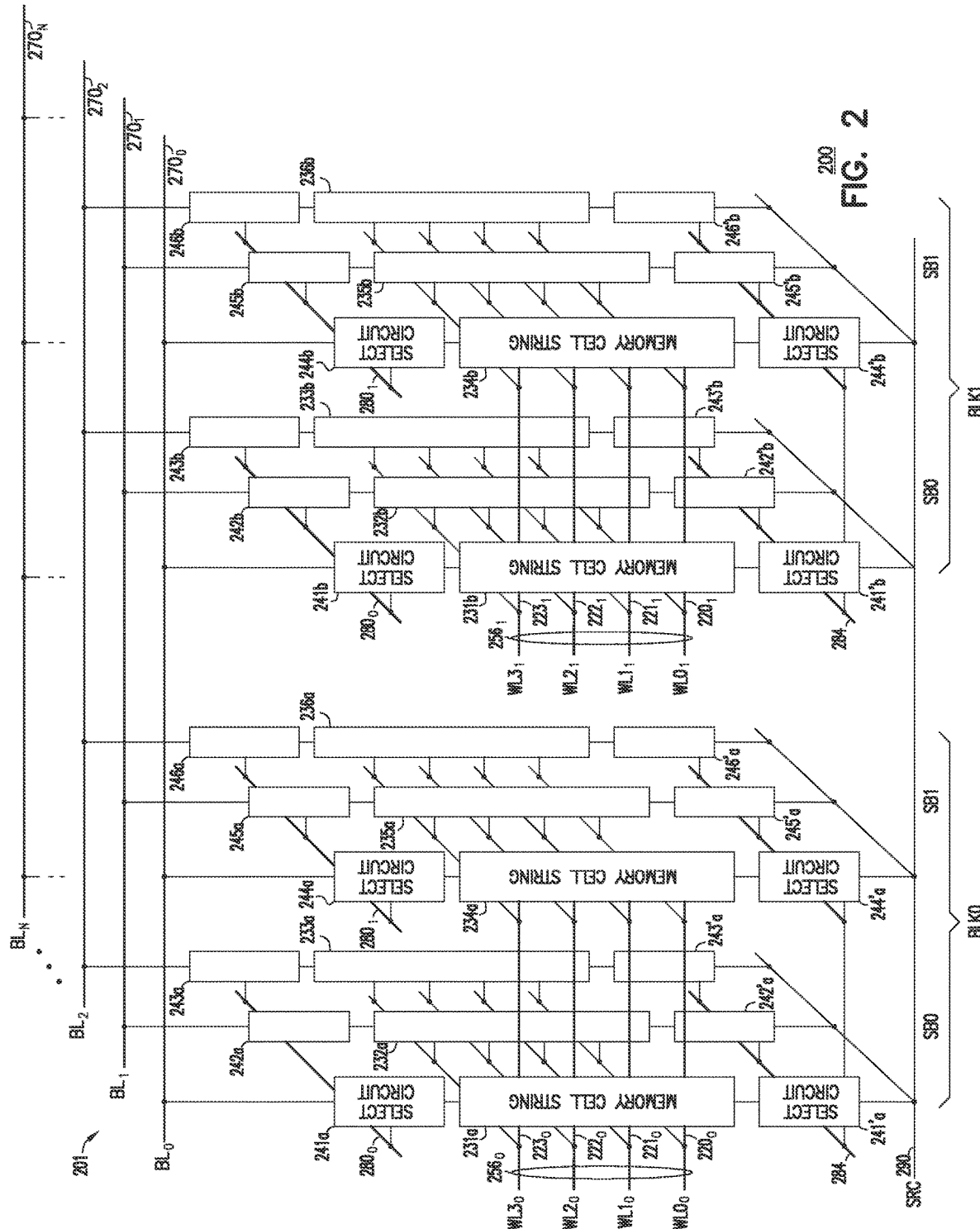
FIG. 2 shows a general schematic diagram of a portion of a memory device including a memory array having memory cell strings and associated select circuits, according to some embodiments described herein.

FIG. 2 shows a general schematic diagram of a portion of a memory device 200 including a memory array 201 having memory cell strings and associated select circuits, according to some embodiments described herein. Memory device 200 can correspond to memory device 100 of FIG. 1. For example, memory array 201 can form part of memory array 101 of FIG. 1.

As shown in FIG. 2, memory device 200 can include blocks (blocks of memory cells) BLK0 and BLK1. Two blocks are shown as an example. Memory device 200 can include many blocks (e.g., up to thousands or more blocks). In the physical structure of memory device 200, the blocks can be arranged (e.g., formed) one block next to another block, such that each block can have a neighboring block. Neighboring blocks are blocks located immediately next to (e.g., adjacent) each other. For example, in the physical structure of memory device 200, blocks BLK0 and BLK1 can be neighboring blocks.

Each of blocks BLK0 and BLK1 of memory device 200 can include (e.g., can be divided into) sub-blocks. For example, each of blocks BLK0 and BLK1 can include sub-blocks SB0 and SB1. Blocks BLK0 and BLK1 can include the same number of sub-blocks. FIG. 2 shows an example where each of blocks BLK0 and BLK1 can include two sub-blocks (e.g., SB0 and SB1). However, each of blocks BLK0 and BLK1 can have more than two blocks (e.g., four sub-blocks SB0, SB1, SB2, and SB3 or more than four sub-blocks).

As shown in FIG. 2, each sub-block (e.g., SB0 or SB1) has its own memory cell strings that can be associated with (e.g., coupled to) respective select circuits. For example, sub-block SB0 of block BLK0 has memory cell strings 231a, 232a, and 233a and associated select circuits (e.g., drain select circuits) 241a, 242a, and 243a, respectively, and select circuits (e.g., source select circuits) 241'a, 242'a, and 243'a, respectively. In another example, sub-block SB1 of block BLK0 has memory cell strings 234a, 235a, and 236a and associated select circuits (e.g., drain select circuits) 244a, 245a, and 246a, respectively, and select circuits (e.g., source select circuits) 244'a, 245'a, and 246'a, respectively.

Similarly, sub-block SB0 of block BLK1 has memory cell strings 231b, 232b, and 233b, and associated select circuits (e.g., drain select circuits) 241b, 242b, and 243b, respectively, and select circuits (e.g., source select circuits) 241'b, 242'b, and 243'b, respectively. Sub-block SB1 of block BLK1 has memory cell strings 234b, 235b, and 236b, and associated select circuits (e.g., drain select circuits) 244b, 245b, and 246b, respectively, and select circuits (e.g., source select circuits) 244'b, 245'b, and 246'b, respectively. The sub-blocks of the blocks (e.g., blocks BLK0 and BLK1) of memory device 200 can have the same number of memory cell strings and associated select circuits.

FIG. 2 shows an example of three memory cell strings and their associated circuits in a sub-block (e.g., in sub-block SB0). The number of memory cell strings and their associated select circuits in each the sub-block of blocks BLK0 and BLK1 can vary. Each of the memory cell strings of memory device 200 can include series-connected memory cells (shown in detail in FIG. 3 and FIG. 4A) and a pillar (e.g., pillar 450 in FIG. 4A) where the series-connected memory cells can be located (e.g., vertically located) along a respective portion of the pillar.

As shown in FIG. 2, memory device 200 can include data lines $270_0$ through $270_N$, that carry signals BL4 through BLN, respectively. Each of data lines $270_0$ through $270_N$ can be structured as a conductive line that can include conductive materials (e.g., conductively doped polycrystalline silicon (doped polysilicon), metals, or other conductive materials).

The memory cell strings of blocks BLK0 and BLK1 can share data lines $270_0$ through $270_N$ to carry information (in the form of signals) read from or to be stored in memory cells of selected memory cells (e.g., selected memory cells in block BLK0 or BLK1) of memory device 200. For example, memory cell strings 231a, 234a (of block BLK0), 231b and 234b (of block BLK1) can share data line $270_0$. Memory cell strings 232a, 235a (of block BLK0), 232b and 235b (of block BLK1) can share data line $270_1$. Memory cell strings 233a, 236a (of block BLK0), 233b and 236b (of block BLK1) can share data line $270_2$.

Memory device 200 can include a source (e.g., a source line, a source plate, or a source region) 290 that can carry a signal (e.g., a source line signal) SRC. Source 290 can be structured as a conductive line or a conductive plate (e.g., conductive region) of memory device 200. Source 290 can be common source (e.g., common source plate or common source region) of blocks BLK0 and BLK1. Alternatively, each of blocks BLK0 and BLK1 can have its own source similar to source 290. Source 290 can be coupled to a ground connection of memory device 200.

Memory device 200 can include control gates (e.g., word lines) $220_0$, $221_0$, $222_0$, and $223_0$ in block BLK0 that can be part of conductive paths (e.g., access lines) $256_0$ of memory device 200 (that can correspond to part of access lines 150 of memory device 100 of FIG. 1). Memory device 200 can include control gates (e.g., word lines) $220_1$, $221_1$, $222_1$, and $223_1$ in block BLK1 that can be part of other conductive paths (e.g., access lines) $256_1$ of memory device 200 (that can correspond to part of access lines 150 of memory device 100 of FIG. 1). Control gates $220_0$, $221_0$, $222_0$, and $223_0$ can be electrically separated from each other. Control gates $220_1$, $221_1$, $222_1$, and $223_1$ can be electrically separated from each other. Control gates $220_0$, $221_0$, $222_0$, and $223_0$ can be electrically separated from control gates $220_1$, $221_1$, $222_1$, and $223_1$. Thus, blocks BLK0 and BLK1 can be accessed separately (e.g., accessed one at a time). For example, block BLK0 can be accessed at one time using control gates $220_0$, $221_0$, $222_0$, and $223_0$, and block BLK1 can be accessed at another time using control gates $220_1$, $221_1$, $222_1$, and $223_1$.

Memory device 200 can have the same number of control gates among the blocks (e.g., blocks BLK0 and BLK1) of memory device 200. In the example of FIG. 2, memory device 200 has four control gates in each of blocks BLK0 and BLK1. FIG. 2 shows memory device 200 including four control gates in blocks BLK0 and BLK1 as an example. The number of control gates in the blocks (e.g., blocks BLK0 and BLK1) of memory device 200 can be different from four. For example, each of blocks BLK0 and BLK1 can include hundreds of control gates.

Each of control gates $220_0$, $221_0$, $222_0$, and $223_0$ can be part of a structure (e.g., a level) of conductive material located in a level of memory device 200. Control gates $220_0$, $221_0$, $222_0$, and $223_0$ can carry corresponding signals (e.g., word line signals) $WL0_0$, $WL1_0$, $WL2_0$, and $WL3_0$. Memory device 200 can use signals $WL0_0$, $WL1_0$, $WL2_0$, and $WL3_0$ to selectively control access to memory cells of block BLK0 during an operation (e.g., read, write, or erase operation). For example, during a read operation, memory device 200 can use signals $WL0_0$, $WL1_0$, $WL2_0$, and $WL3_0$ to control access to selected memory cells of block BLK0 to read (e.g., sense) information (e.g., previously stored information) from the memory cells of block BLK0. In another example, during a write operation, memory device 200 can use signals $WL0_1$, $WL1_1$, $WL2_1$, and $WL3_1$ to control access to selected memory cells of block BLK0 to store information in the selected memory cell of block BLK0.

Each of control gates $220_1$, $221_1$, $222_1$, and $223_1$ can be part of a structure (e.g., a level) of conductive material located in a level of memory device 200. Control gates $220_1$, $221_1$, $222_1$, and $223_1$ can carry corresponding signals (e.g., word line signals) $WL0_1$, $WL1_1$, $WL2_1$, and $WL3_1$. Memory device 200 can use signals $WL0_1$, $WL1_1$, $WL2_1$, and $WL3_1$ to selectively control access to memory cells of block BLK1 during an operation (e.g., read, write, or erase operation). For example, during a read operation, memory device 200 can use signals $WL0_1$, $WL1_1$, $WL2_1$, and $WL3_1$ to control access to selected memory cells of block BLK1 to read (e.g., sense) information (e.g., previously stored information) from the memory cells of block BLK1. In another example, during a write operation, memory device 200 can use signals $WL0_1$, $WL1_1$, $WL2_1$, and $WL3_1$ to control access to selected memory cells of block BLK1 to store information in the selected memory cell of block BLK1.

As shown in FIG. 2, in sub-block SB0 of block BLK0, memory device 200 includes a select line (e.g., drain select line) $280_0$ that can be shared by select circuits 241a, 242a, and 243a. In sub-block SB1 of block BLK0, memory device 200 includes a select line (e.g., drain select line) $280_1$ that can be shared by select circuits 244a, 245a, and 246a. Block BLK0 can include a select line (e.g., source select line) 284 that can be shared by select circuits 241'a, 242'a, 243'a, 244'a, 245'a, and 246'a.

In sub-block SB0 of block BLK1, memory device 200 includes a select line (e.g., drain select line) $280_0$ that can be shared by select circuits 241b, 242b, and 243b. Select line $280_0$ of block BLK0 is electrically separated from select line $280_0$ of block BLK1. In sub-block SB1 of block BLK1, memory device 200 includes a select line (e.g., drain select line) $280_1$ that can be shared by select circuits 244b, 245b, and 246b. Select line $280_1$ of block BLK0 is electrically separated from select line $280_1$ of block BLK1. Block BLK1 can include a select line (e.g., source select line) 284 that can be shared by select circuits 241'b, 242'b, 243'b, 244'b, 245'b, and 246'b.

In FIG. 2 shows the same labels for select line $280_0$ and $280_1$ in blocks BLK0 and BLK1 for simplicity. However, select lines $280_0$ and $280_1$ in block BLK0 are electrically separated from select lines $280_0$ and $280_1$ in block BLK1, respectively.

FIG. 2 shows an example where memory device 200 includes one drain select line (e.g., select line $280_0$ or $280_1$) associated with a drain select circuit (e.g., select circuits 241a, 242a, or 243a) in a sub-block (e.g., sub-block SB0 of block BLK0). However, memory device 200 can include multiple drain select lines associated with a drain select circuit.

FIG. 2 shows an example where memory device 200 includes one source select line (e.g., select line 284) associated with a source select circuit (e.g., select circuits 241'a, 242'a, or 243'a) in a sub-block (e.g., sub-block SB0 of block BLK0). However, memory device 200 can include more than one source select line associated with a source select circuit.

Each of the drain select circuits of memory device 200 can include a drain select gate (e.g., a transistor) coupled between a respective data line and a respective memory cell string. The drain select gate can be controlled (e.g., turned on or turned off) by the drain select line based on a voltage provided to the signal on the drain select line.

Each of the source select circuits of memory device 200 can include a select gate (shown in FIG. 3) coupled between source 290 and a respective memory cell string. The source select gate can be controlled (e.g., turned on or turned off) by the source select line based on a voltage provided to the signal on the source select line.

In FIG. 2, each of the memory cell strings of memory device 200 has memory cells (shown in FIG. 3) arranged in a string (e.g., coupled in series among each other) to store information. During an operation (e.g., read, write, or erase operation) of memory device 200, the memory cell strings can be individually selected to access the memory cells in the selected memory cell string in order to store information in or read information from the selected memory cell string. One or both select circuits (a drain select circuit and a source select circuit) associated with a selected memory cell string can be activated (e.g., by turning on the select gate (e.g., transistor) in the select circuit (or selected circuits)), depending on which operation memory device 200 performs on the selected memory cell string.

Activating a particular select circuit among the select circuits of memory device 200 during an operation of memory device 200 can include providing (e.g., applying) a voltage having a certain value to the signal on the select line associated with that particular select circuit. When a particular drain select circuit of memory device 200 is activated, it can electrically connect (e.g., form a current path from) a selected memory cell string associated with that particular select circuit to a respective data line (e.g., one of data lines $270_0$ through $270_N$). When a particular source select circuit is activated, it can electrically connect (e.g., form a current path from) a selected memory cell string associated with that particular select circuit to source 290.

Figure 3:
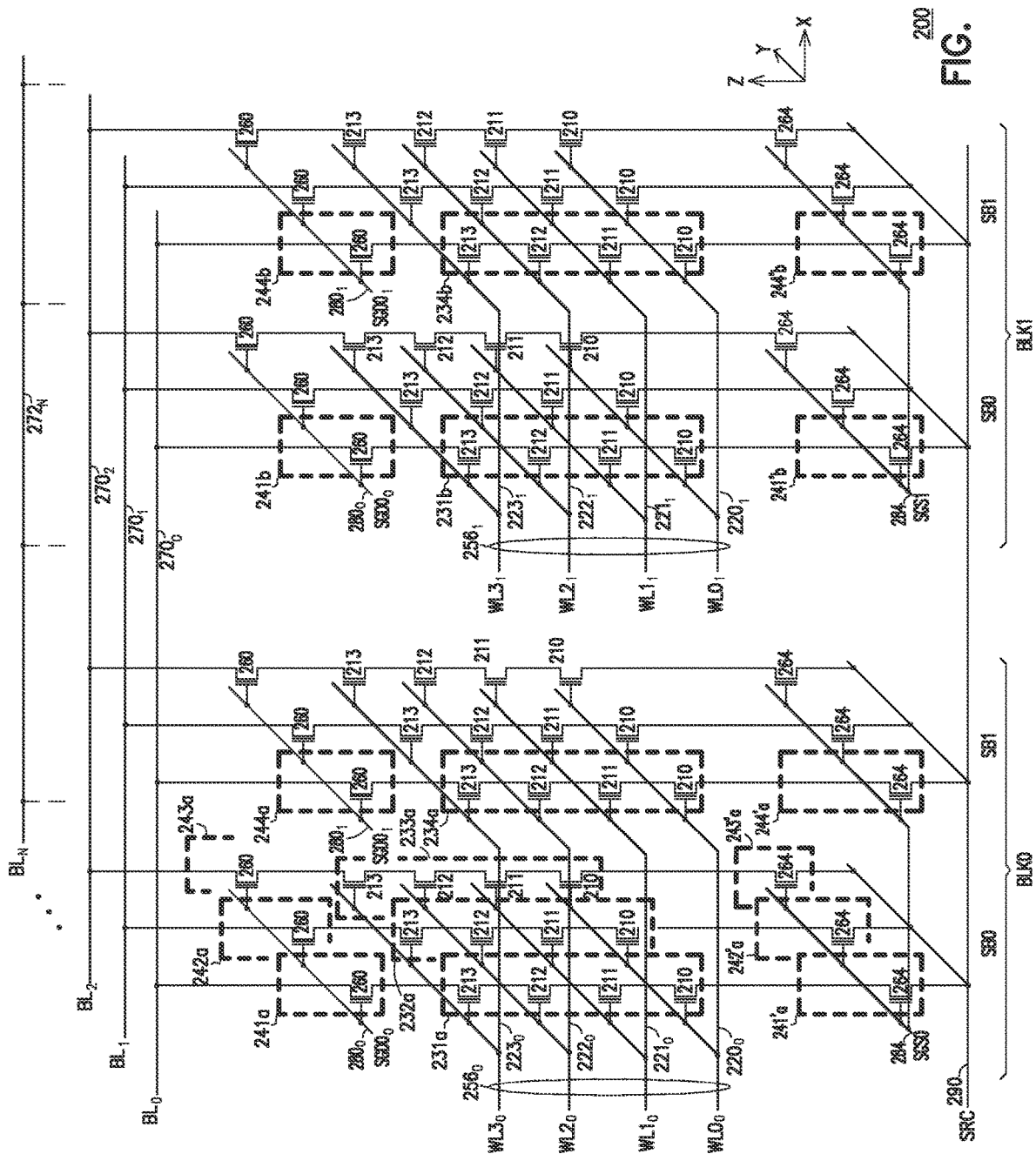
FIG. 3 shows a detailed schematic diagram of the memory device of FIG. 2, according to some embodiments described herein.

FIG. 3 shows a detailed schematic diagram of memory device 200 of FIG. 2, according to some embodiments described herein. For simplicity, only some of the memory cell strings and some of the select circuits of memory device 200 of FIG. 2 are labeled in FIG. 3. Directions X, Y, and Z in FIG. 3 can be relative to the physical directions (e.g., dimensions) of the structure of memory device 200. For example, the Z-direction can be a direction perpendicular to (e.g., vertical direction with respect to) a substrate of memory device 200 (e.g., a substrate 499 shown in FIG. 4A). The Z-direction is perpendicular to the X-direction and Y-direction (e.g., the Z-direction is perpendicular to an X-Y plane of memory device 200).

As shown in FIG. 3, each select line can carry an associated select signal. For example, in sub-block SB0 of block BLK0, select line (e.g., drain select line) $280_0$ can carry an associated signal (e.g., drain select-gate signal) $SGD0_0$. In sub-block SB1 of block BLK0, select line (e.g., drain select line) $280_1$ can carry an associated signals $SGD0_1$. Sub-blocks SB0 and SB1 of block BLK0 can share select line 284 and associated signal (e.g., source select-gate signal) SGS0 of block BLK0.

In sub-block SB0 of block BLK1, select line (e.g., drain select line) $280_0$ can carry an associated signal $SGD0_0$. In sub-block SB1 of block BLK1, select line (e.g., drain select line) $280_1$ can carry an associated signal $SGD0_1$. Sub-blocks SB0 and SB1 of block BLK1 can share select line 284 and associated signal (e.g., source select-gate signal) SGS1 of block BLK1.

As shown in FIG. 3, memory device 200 can include memory cells 210, 211, 212, and 213; select gates (e.g., drain select gates or transistors) 260; and select gates (e.g., source select gates) 264 that can be physically arranged in three dimensions (3D), such as X, Y, and Z directions (e.g., dimensions), with respect to the structure (shown in FIG. 4A) of memory device 200.

In FIG. 3, each of the memory cell strings (e.g., memory cell strings 231a, 232a, 233a, 234a, 231b, and 234b) of memory device 200 can include one of memory cells 210, one of memory cells 211, one of memory cells 212, and one of memory cells 213. FIG. 3 shows an example of four memory cells 210, 211, 212, and 213 in each memory cell string. The number of memory cells in each memory cell string can vary.

As shown in FIG. 3, each of select circuits (e.g., drain select circuits) 241a, 242a, 243a, 244a, 241b, and 244b can include a select gate 260. FIG. 3 shows an example where memory device 200 includes one drain select gate (e.g., select gate 260) in each drain select circuit. However, memory device 200 can include multiple drain select gates in each drain select circuit, depending on the number of drain select lines associated with each drain select circuit. The number of drain select gates in each drain select circuit can be equal to the number of drain select lines associated with each drain select circuit.

Each of select circuits (e.g., source select circuits) 241'a, 242'a, 243'a, 244'a, 241'b, and 244'b can include a select gate 264. FIG. 3 shows an example where memory device 200 includes one source select gate (e.g., select gate 264) in each source select circuit. However, memory device 200 can include multiple source select gates in each source select circuit, depending on the number of source select lines associated with each source select circuit. The number of source select gates (e.g., one in the example of in FIG. 3) in each source select circuit can be equal to the number of source select lines (e.g., one in the example of in FIG. 3) associated with each source select circuit.

Each of select gates 260 and 264 can operate as a transistor. For example, select gate 260 of select circuit 241a can operate as a field effect transistor (FET), such as a metal-oxide semiconductor FET (MOSFET). An example of such a MOSFET includes an n-channel MOS (NMOS) transistor.

As shown in FIG. 3, a select line shared among particular select circuits can be shared by respective select gates of those particular select circuits. For example, select line $280_0$ of sub-block SB0 of block BLK0 can be shared by select gates 260 of select circuits 241a, 242a, and 243a of sub-block SB0 of block BLK0. In another example, select line 284 of sub-block SB0 of block BLK0 can be shared by select gates 264 of select circuits 241'a, 242'a, and 243'a of sub-block SB0 of block BLK0.

A select line (e.g., select line $280_0$ of sub-block SB0 of block BLK0) can carry a signal (e.g., signal $SGD0_0$) but it does not operate like a switch (e.g., a transistor). A select gate (e.g., select gate 260 of select circuit 241a of sub-block SB0 of block BLK0) can receive a signal (e.g., signal $SGD0_0$) from a respective select line (e.g., select line $280_0$ of sub-block SB0 of block BLK0) and can operate like a switch (e.g., a transistor).

In the physical structure of memory device 200, a select line (e.g., select line $280_0$ of sub-block SB0 of block BLK0) can be a structure (e.g., a level) of a conductive material (e.g., a layer (e.g., a piece) of conductive material) located in a single level of memory device 200. The conductive material can include metal, doped polysilicon, or other conductive materials.

In the physical structure of memory device 200, a select gate (e.g., select gate 260 of select circuit 241a of sub-block SB0 of block BLK0) can include (can be formed from) a portion of the conductive material of a respective select line (e.g., select line $280_0$ of sub-block SB0 of block BLK0), a portion of a channel material (e.g., polysilicon channel), and a portion of a dielectric material (e.g., similar to a gate oxide of a transistor (e.g., FET)) between the portion of the conductive material and the portion of the channel material.

Figure 4A:
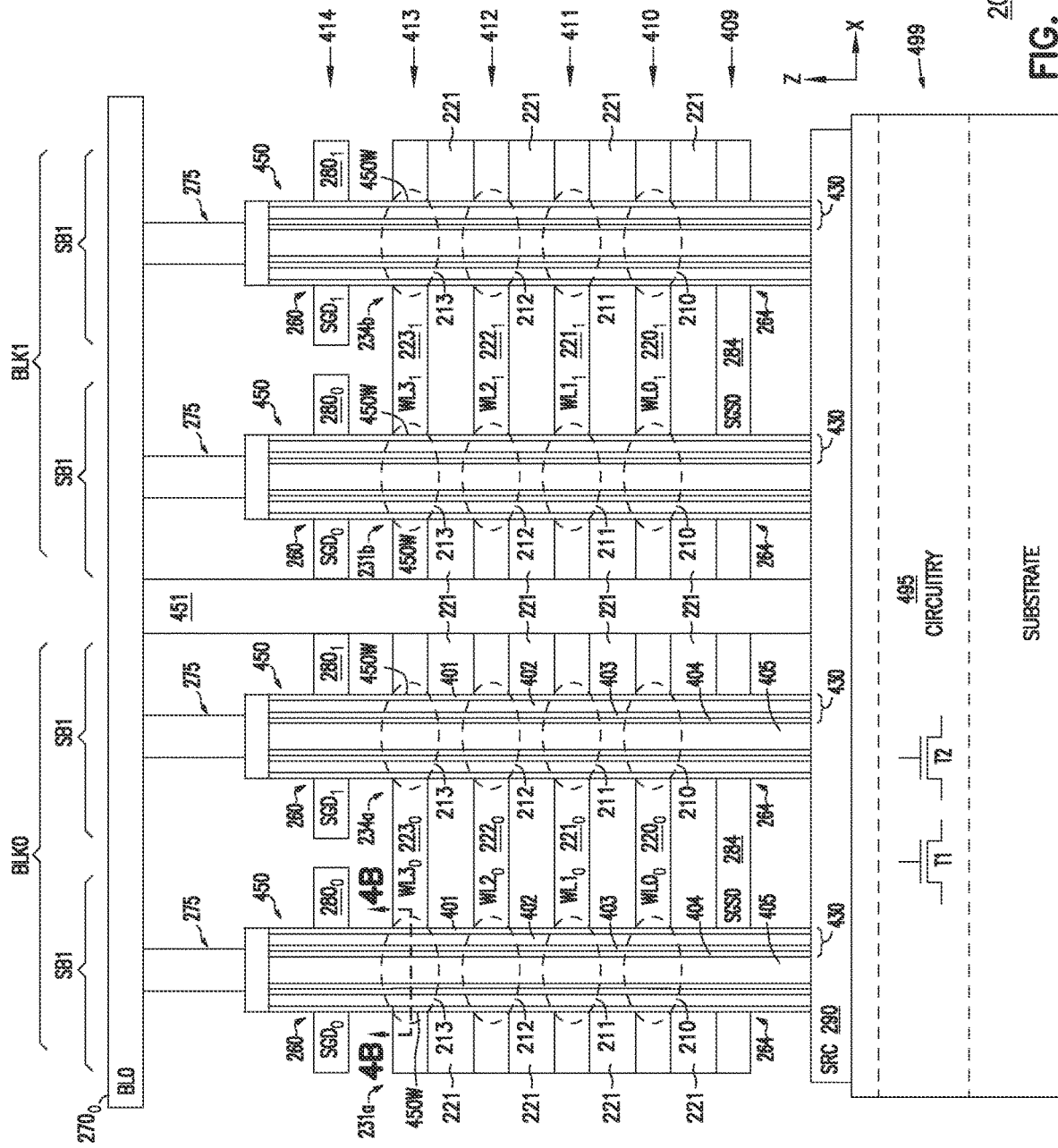
FIG. 4A shows a side view (e.g., cross-section) of a structure of a portion of the memory device of FIG. 3 including memory cell strings having pillars extending through control gates in two blocks of memory cells, and a dielectric structure between the two blocks, according to some embodiments described herein.
Figure 4B:
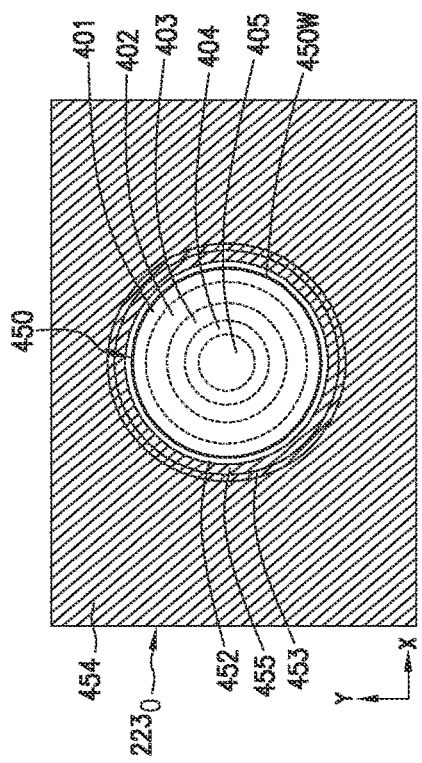
FIG. 4B shows a cross-section of portion of a pillar and a portion of a control gate of the memory device of FIG. 4A, according to some embodiments described herein.
Figure 4C:
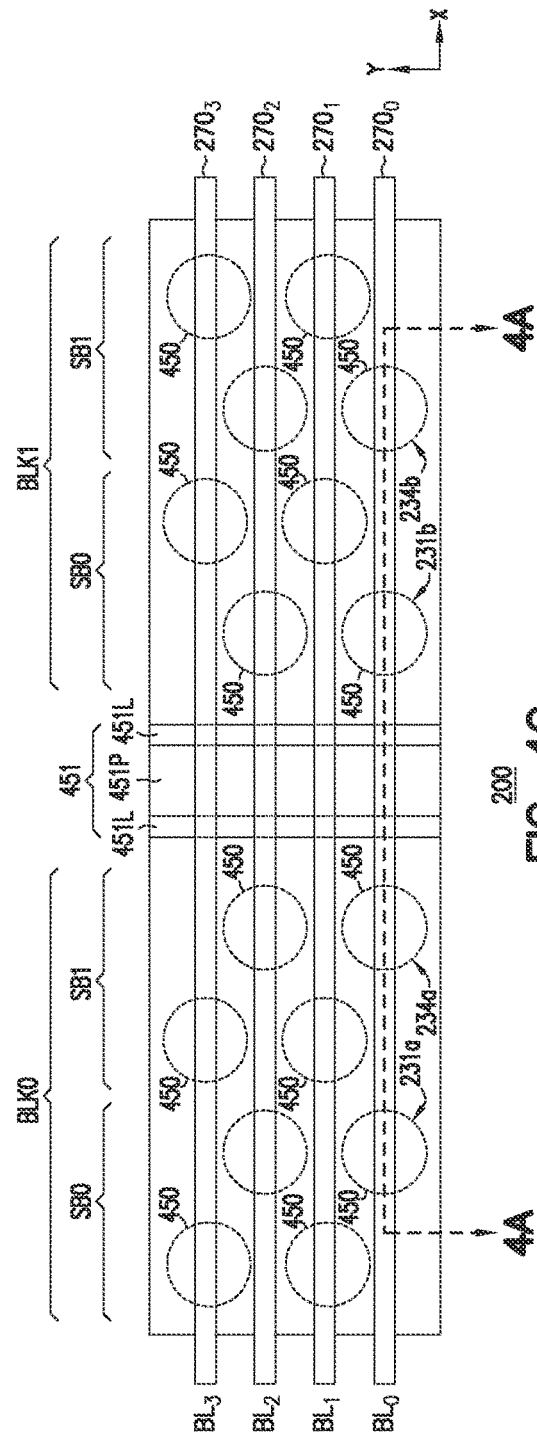
FIG. 4C shows a top view of a portion of the memory device of FIG. 4A including relative locations of the blocks, dielectric structures, the pillars of memory cell strings, and the data lines of the memory device, according to some embodiments described herein.

FIG. 4A shows a side view (e.g., cross-section) of a structure of a portion of memory device 200 of FIG. 3 including control gates $220_0$, $221_0$, $222_0$, and $223_0$ of block BLK0, control gates $220_1$, $221_1$, $222_1$, and $223_1$ of block BLK1, pillars (pillars of memory cells) 450 in respective blocks BLK0 and BLK1, a dielectric structure 451 between blocks BLK0 and BLK1, according to some embodiments described herein. FIG. 4B and FIG. 4C (described below after the description of FIG. 4A) show more views of memory device 200. FIG. 4B shows a cross-section of a portion of a control gate $223_0$ and an adjacent pillar 450 of memory device 200 taken along line 4B-4B of FIG. 4A. FIG. 4C shows a top view of memory device 200 of FIG. 4A including relative locations of the blocks (e.g., blocks BLK0 and BLK1), dielectric structure 451, pillars 450, and data lines $270_0$, $270_1$, $270_2$, and $270_3$. The following description refers to FIG. 4A.

The structure of memory device 200 in FIG. 4A corresponds to part of the schematic diagram of memory device 200 shown in FIG. 3. For simplicity, some elements of memory device 200 of FIG. 3 are omitted from the structure of the portion of memory device 200 shown in FIG. 4A.

For simplicity, cross-section lines (e.g., hatch lines) are omitted from some or all the elements shown in the drawings described herein. Some elements of memory device 200 (and other memory devices described herein) may be omitted from a particular figure of the drawings so as not to obscure the view or the description of the element (or elements) being described in that particular figure. Further, the dimensions (e.g., physical structures) of the elements shown in the drawings described herein are not scaled.

As shown in FIG. 4A, memory device 200 can include a substrate 499 over which memory cells 210, 211, 212, and 213 of memory cell strings 231a, 234a, 231b, and 234b of respective sub-blocks SB0 and SB1 of blocks BLK0 and BLK1 can be formed (e.g., formed vertically in z-direction with respect to source 290 and substrate 499). Dielectric structure 451 can electrically separate block BLK0 from block BLK1. Dielectric structure 451 can have a depth (e.g., height) in the Z-direction. The depth of dielectric structure 451 can be a distance (e.g., vertical distance) between a source 290 and a data line (e.g., data line $270_0$ or $270_1$).

As shown in FIG. 4A, memory device 200 can include different levels 409 through 414 with respect to a Z-direction. Levels 409 through 414 are internal device levels between substrate 499 and data line $270t$.

Substrate 499 of memory device 200 can include monocrystalline (also referred to as single-crystal) semiconductor material. For example, substrate 499 can include monocrystalline silicon (also referred to as single-crystal silicon). The monocrystalline semiconductor material of substrate 499 can include impurities, such that substrate 499 can have a specific conductivity type (e.g., n-type or p-type).

As shown in FIG. 4A, memory device 200 can include circuitry 495 located in (e.g., formed in) substrate 499. At least a portion of circuitry 495 (e.g., the entire circuitry 495 or only a portion of circuitry 495) can be located in a portion of substrate 499 that is under (e.g., directly under) memory cell strings 231a, 234a, 231b, and 234b. Circuitry 495 can include circuit elements (e.g., transistors T1 and T2 and other transistors (not shown)) coupled to other circuit elements outside substrate 499. For example, data lines $270_0$ (FIG. 4A) and control gates $220_0$, $221_0$, $222_0$, $223_0$ of block BLK0 and control gates $220_1$, $221_1$, $222_1$, and $223_1$ of block BLK1 can be coupled to circuit elements of memory device 200. Circuitry 495 can include decoder circuits, driver circuits, buffers, sense amplifiers, charge pumps, and other circuitry of memory device 200. Transistors T1 and T2 (and other transistors, not shown) of circuitry 495 can be part of (e.g., can represent) such decoder circuits, driver circuits, buffers, sense amplifiers, charge pumps, and other circuitry of memory device 200.

Source 290 can include a conductive material (or materials (e.g., different levels of materials)) and can have a length extending in the X-direction. FIG. 4A shows an example where source 290 can be formed over a portion of substrate 499 (e.g., by depositing a conductive material over substrate 499). Alternatively, source 290 can be formed in or formed on a portion of substrate 499 (e.g., by doping a portion of substrate 499).

As shown in FIG. 4A, select lines (e.g., drain select lines) $280_0$ and $280_1$ of each of blocks BLK0 and BLK1 can be located in level 414. Select line (e.g., source select line) 284 of each of blocks BLK0 and BLK1 can be located in the same level (e.g., level 409) between substrate 499 and memory cell strings 231a, 234a, 231b, and 234b. The memory cells of a respective memory cell string (memory cell strings 231a, 234a, 231b, and 234b) can be located of different levels among levels 410 through 413.

As shown in FIG. 4A, memory device 200 can include conductive structures 275 coupled between respective pillars 450 and data line $270_0$.

As shown in FIG. 4A, a select line (e.g., $280_0$) can be a structure (e.g., a level) of a conductive material (e.g., a layer (e.g., a piece) of conductive material or materials) located in a single level of memory device 200. As described above, a select line can carry a signal (e.g., signal $SGD0_0$) but it does not operate like a switch (e.g., a transistor). A select gate (e.g., 260) can include a portion of a respective select line (e.g., a portion of the piece of the conductive material that forms the respective select line) and additional structures to perform a function (e.g., function of a transistor). For example, in FIG. 4A, select gate 260 of sub-block SB0 of block BLK0 can include a portion of select line $280_0$ of sub-block SB0 of block BLK0 and a portion of pillar 450 adjacent select line $280_0$ of sub-block SB0 of block BLK0.

As shown in FIG. 4A, memory cells 210, 211, 212, and 213 of memory cell strings 231a, 234a, 231b, and 234b can be located in levels 410, 411, 412, and 413, respectively. Control gates $220_0$, $221_0$, $222_0$, and $223_0$ (associated with memory cells 210, 211, 212, and 213, respectively) of block BLK0 can be located in levels 410, 411, 412, and 413, respectively, adjacent respective portions (e.g., sidewalls) 450W of pillars 450 in block BLK0. Control gates $220_1$, $221_1$, $222_1$, and $223_1$ (associated with memory cells 210, 211, 212, and 213, respectively) of block BLK1 can be located in levels 410, 411, 412, and 413, respectively, adjacent respective portions (e.g., sidewalls) 450W of pillars 450 in block BLK1. As shown in FIG. 4A, control gates $220_0$, $221_0$, $222_0$, and $223_0$ can be located on the same levels at which control gates $220_1$, $221_1$, $222_1$, and $223_1$, respectively, are located.

Memory device 200 can include dielectric materials (e.g., levels of dielectric materials) 221 interleaved (in the Z-direction) with control gates $220_0$, $221_0$, $222_0$, and $223_0$ of block BLK0, and control gates $220_1$, $221_1$, $222_1$, and $223_1$ of block BLK1 between different levels (e.g., levels interleaved with levels 409 through 413) of memory device 200. Dielectric materials 221 can include silicon dioxide. For simplicity. FIG. 4A omits dielectric materials (e.g., silicon dioxide) located between other elements of memory device 200.

As shown in FIG. 4A, memory device 200 can include pillars (memory cell pillars) 450 in respective sub-blocks SB0 and SB1 of blocks BLK0 and BLK1. Each of pillars 450 can be part of a respective memory cell string. Each of pillars 450 can have length extending outwardly (e.g., extending vertically in the direction of the Z-direction).

As shown in FIG. 4A, memory cells 210, 211, 212, and 213 and control gates $220_0$, $221_0$, $222_0$, $223_0$, $220_1$, $221_1$, $222_1$, and $223_1$ can be located (e.g., stacked in one level (e.g., layer) over another in the Z-direction) along respective portions (e.g., segments) of pillars 450 in the Z-direction.

Memory device 200 can include a structure 430 and a dielectric material 405 that can be part of a respective pillar of pillars 450 and extending continuously along a length of the respective pillar. Dielectric material 405 can include silicon dioxide. Structure 430 can be electrically coupled to source 290 and a respective data line (e.g., data line $270_0$). Structure 430 of a respective pillar 450 is adjacent (e.g., contacts) portions of respective control gates. For example, structure 430 of pillar 450 in block BLK0 is adjacent (e.g., contacts) control gates $220_0$, $221_0$, $222_0$, and $223_0$ of block BLK0.

As shown in FIG. 4A, structure 430 can include portions 401, 402, 403, and 404. Each of memory cells 210, 211, 212, and 213 of a memory cell string can include part of each of portions 401, 402, 403, and 404 that is located adjacent one of the control gates (one of control gates $220_0$, $221_0$, $222_0$, and $223_0$, $220_1$, $221_1$, $222j$, and $223_1$). For example, memory cell 213 of memory cell string 231a can include part of structure 430 (portions 401, 402, 403, and 404) that is adjacent control gates $223_0$. In another example, memory cell 212 of memory cell string 231a can include part of structure 430 (portions 401, 402, 403, and 404) that is adjacent control gates $222_0$.

Structure 430 can include a conductive structure (e.g., portion 404) that can be part of a conductive path (e.g., pillar channel structure) to conduct current between data line $270_0$ and source 290. Structure 430 can be part of a ONOS ($SiO_2$, $Si_3N_4$, $SiO_2$, Si) structure. For example, portion 401 can include $SiO_2$, and can be combined with part of an adjacent control gate to form a charge blocking material (or materials) that are capable of blocking a tunneling of a charge. Portion 402 can include a charge storage element (e.g., charge storage portion, charge storage material (or materials), such as $Si_3N_4$) that can provide a charge storage function (e.g., trap charge) to represent a value of information stored in memory cells 210, 211, 212, or 213. Portion 403 can include a dielectric, such as a tunnel dielectric material or materials (e.g., $SiO_2$), that is capable of allowing tunneling of a charge (e.g., electrons). Portion 404 can include polysilicon (e.g., doped or undoped polysilicon) and can be a channel structure (e.g., pillar channel) that can conduct current during operation of memory device 200. As an example, portion 403 can allow tunneling of electrons from portion 404 to portion 402 during a write operation and tunneling of electrons from portion 402 to portion 404 during an erase operation of memory device 200. Moreover, portion 403 can allow tunneling of holes from portion 404 to portion 402, compensating the trapped electron recombination during an erase operation of memory device 200.

In an alternative arrangement, structure 430 can be part of a SONOS (Si, SiO2, Si3N4, SiO2, Si) structure. In another alternative arrangement, structure 430 can be part of a floating gate structure (e.g., portion 402 can be polysilicon). FIG. 4A shows an example of structure 430 having a particular shape (e.g., the shape shown in FIG. 4A). However, structure 430 can have a different shape.

FIG. 4B shows a cross-section of a portion of memory device 200 (taken along line 4B-4B of FIG. 4A) including a portion of control gate $223_0$ and adjacent pillar 450 at memory cell 213 of memory cell string 231a, according to some embodiments described herein. Other control gates and pillars of memory cell strings of memory device 200 have similar or the same structure shown in FIG. 4B.

As shown in FIG. 4B, control gate $223_0$ can include (e.g., can be formed from) a combination of materials, including a dielectric material 452 (e.g., high-k dielectric material), a material (e.g., material containing titanium) 455, a material 453 (e.g., metal (e.g., tungsten)), and a material 454 (e.g., metal (e.g., tungsten)).

Material 454 can contact (e.g., can be directly coupled to) material 453. Material 453 can contact (e.g., can be directly coupled to) material 455. Material 455 can contact (e.g., can be directly coupled to) dielectric material 452. Dielectric material 452 can contact (e.g., can be directly coupled to) portion 450W of pillar 450.

Portion 450W can include part of portion 401 (e.g., silicon dioxide) of pillar 450. Although dielectric material 452 (e.g., high-k dielectric material) is described herein as part of control gate $223_0$, dielectric material 452 can be part of pillar 450 (instead of control gate $223_0$). For example, dielectric material 452 (e.g., high-k dielectric material) can be part of control gate $223_0$, such that dielectric material 452 is formed after pillar 450 is formed. In another example, dielectric material 452 (e.g., high-k dielectric material) can be part of pillar 450, such that dielectric material 452 is formed as part of forming pillar 450 (e.g., formed when pillar 450 is formed).

Dielectric material 452 can have a thickness (in the X-direction) in the range from 2 nanometers (nm) to 5 nm. Alternatively, dielectric material 452 can have a thickness greater than 5 nm. Material 453 can have a thickness (in the X-direction) in the range from 2 nm to 5 nm. Material 455 can have a thickness (in the X-direction) in the range from 2 nm to 5 nm. Alternatively, material 455 can have a thickness greater than 5 nm. For comparison purposes, the thickness (in the Z-direction) of dielectric material 221 (FIG. 4A) can be in the range from 20 nm to 30 nm. Thus, as an example, the thickness of material 455 can be one-tenth (0.1) or about one-tenth the thickness of dielectric material 221.

Dielectric material 452 can include a high-k (or hi-k) dielectric material or a combination of high-k dielectric materials. A high-k dielectric material is a dielectric material that has a dielectric constant greater than the dielectric constant of silicon dioxide. Dielectric material 452 can be structured (e.g., configured) to shield (e.g., protect) the dielectric material (e.g., silicon dioxide) of portion 401 of pillar 450 from some processes (e.g., etch processes) during the processes of forming memory device 200, for example, processes of forming part of control gate $223_0$ and part of other control gates of memory device 200. Dielectric material 452 can also be structured (e.g., configured) to block a tunneling of charge from pillar 450 (e.g., from portion 402 (e.g., charge storage portion) of pillar 450) to other portions (e.g., material 453 or 454, or both) of control gate $223_0$.

For example, dielectric material 452 can include aluminum oxide (AlOx). In another example, dielectric material 452 can include titanium silicon nitride (TiSiN). In another example, dielectric material 452 can contain hafnium. Examples of dielectric material 452 containing hafnium include hafnium oxide (HfOx) and hafnium silicate (HfSiOx).

The materials of dielectric material 452 listed herein are examples. However, other dielectric materials (e.g., other high-k dielectric materials) can be used. For example, other dielectric materials having a dielectric constant greater than the dielectric constant of aluminum oxide can be used.

Further, for control gate $223_O$ and other control gates of memory device 200, using some high-k dielectric materials for dielectric material 452 may provide more benefit than using other high-k dielectric materials for dielectric material 452. For example, using a dielectric material containing hafnium (e.g., HfOx, HfSiOx, or other hafnium-based dielectric materials) for dielectric material 452 may result in memory device 200 having a relatively wider program-erase window (P/E window) in comparison with memory device 200 using aluminum oxide (AlOx) for dielectric material 452.

Material 455 can include a conductive material. Material 455 can be structured (e.g., configured) to improve work function for memory cell operation of memory device 200. Alternatively or additionally, material 455 can also be configured to assist adhesion and nucleation of material 453, 454 or both to dielectric material 452. Material 455 can contain titanium, nitrogen, or both. For example, material 455 can include titanium silicon nitride (TiSiN). In another example, material 455 can include titanium nitride (TiN).

As shown in FIG. 4B, material 455 can have continuous structure, such that it can be completely formed on (e.g., completely coats) dielectric material 452. For example, material 455 can be a relatively thin layer (e.g., from 2 nm to 5 nm, or alternatively greater than 5 nm) of TiSiN (or alternatively TiN) conformal to dielectric material 452 (e.g., conformal to the sidewall of dielectric material 452). Alternatively, material 455 can have a discontinuous structure, such that it may not be completely conformal to dielectric material 452 (e.g., may not completely coat the sidewall of dielectric material 452).

Material 453 can include a conductive material. For example, material 453 can include tungsten (W). Material 454 can include a conductive material. For example, material 454 can include tungsten (W). Although both materials 453 and 454 can include tungsten, materials 453 and 454 can include tungsten of different forms (e.g., beta and alpha phases). For example, a majority (e.g., greater than 50 percent by volume) of tungsten in material 453 is beta-phase tungsten (β-W), and a majority (e.g., greater than 50 percent by volume) of tungsten in material 454 is alpha-phase tungsten (α-W).

The alpha-phase tungsten in material 454 have a larger grain size than the is beta-phase tungsten in material 453. In discussing grain size of the alpha-phase tungsten material, person skilled in the art will recognize that the grains will often be irregularly shaped. Accordingly, grain sizes discussed herein are relative to the maximum (i.e., longest) dimension through individual grains; and the discussion herein addresses such maximum dimension as being "at least" of an identified reference value, to distinguish smaller grains in which the maximum dimension is less than the identified reference value.

In some examples, a majority of the tungsten in material 454 (FIG. 4B) have a maximum dimension of 50 nm (or about 50 nm) or greater, with some examples including grains having a maximum dimension of at least 80 nm (or at least about 80 nm), and in some examples of at least 100 nm (or at least about 100 nm). For some examples, the tungsten in material 454 having grains having a maximum dimension in excess of about 50 nm may form at least about 50% or greater of material 454. In other examples, the tungsten in material 454 having grains with a maximum dimension of 50 nm may offer beneficial electrical properties if present in only about 40% of material 454. The term "about" herein is meant to include a variance of ±10 percent of the structure or characteristic to which it is applied, to provide for variances of manufacturing processes, measuring techniques, etc.

Thus, materials 453 and 454 can form a tungsten structure that can exhibit different properties (e.g., characteristics) of tungsten in different portions of the tungsten structure of control gate $223_O$. For example, the portion of the tungsten structure formed by material 453 can exhibit a property (e.g., characteristics) of beta-phase tungsten, and the portion of the tungsten structure formed by material 454 can exhibit a property (e.g., characteristics) of alpha-phase tungsten. Material (e.g., beta-phase tungsten) 453 has substantially higher resistivity (for example, in some implementations, approximately 3 to 10 times greater resistivity) than that of material (e.g., alpha-phase tungsten) 454.

In some examples, the resistance of material 454 of control gate $223_O$ (FIG. 4A) can be relatively low (for example, on the order of 2-4 Ω/sq for about a 20 nm in one dimension (e.g., width in the Z-direction) structure that is 65-100 nm in another dimension (e.g., length in the X-direction) compared with alpha-phase tungsten of a conventional control gate formed without a beta-phase tungsten (the alpha-phase tungsten of a conventional control gate may be, for example, >5 Ω/sq for a similar structure).

Thus, material 453 can have a crystal structure (e.g., crystal structure of beta-phase tungsten) that is different from a crystal structure (e.g., alpha-phase tungsten) of material 454. The crystal structures of materials 453 and 454 can be observed (e.g., detected) using orientation and phase mapping in transmission electron microscopy (TEM), or using other techniques.

In another example, material 453 can have an X-ray diffraction (XRD) signature (e.g., XRD signature of beta-phase tungsten) that is different from an X-ray diffraction (XRD) signature (e.g., XRD signature of alpha-phase tungsten) of material 454. An X-ray diffractometer (or other equipment) can be used to measure XRD signatures of materials 453 and 454.

Since materials 453 and 454 can include tungsten (e.g., beta-phase tungsten and alpha-phase tungsten, respectively), materials 453 and 454 can form a tungsten structure (or a structure of tungsten material) and can be called a tungsten material. Thus, as described herein, the tungsten structure (or tungsten material) of control gate $223_O$ shown in FIG. 4B can include a portion of beta-phase tungsten (from material 453) that contacts (e.g., touches) dielectric material 452, and a portion of alpha-phase tungsten (from material 454) that contacts (e.g., interfaces with) the beta-phase tungsten.

In an alternative structure of control gate $223_O$ (and other control gates) of memory device 200, material 455 can be excluded from (e.g., not formed in) control gate $223_O$ and other control gates of memory device 200. Thus, in such an alternative structure, material 453 (e.g., beta-phase tungsten) can contact (e.g., can be directly coupled to) dielectric material (e.g., high-K dielectric material) 452. However, including material 455 in the structure of control gate $223_O$ (as shown in FIG. 4B) can improve the operations of memory device 200 in comparison with the structure of control gate $223_0$ without having material 455. For example, including material 455 (e.g., TiSiN or TiN) in control gate $223_0$ (and other control gates) of memory device 200 can result in memory device 200 having a relatively wider program-erase window in comparison with memory device 200 without material 455 in control gate $223_0$ (and other control gates) of memory device 200.

FIG. 4C shows a top view of memory device 200 of FIG. 4A including relative locations of the blocks (e.g., blocks BLK0 and BLK1), dielectric structure 451, pillars 450 of memory cell strings, and data lines $270_0$, $270_1$, $270_2$, and $270_3$. For simplicity, not all memory cell strings (which include respective pillars 450) in FIG. 4C are labeled. Some of the elements of memory device 200 of FIG. 4C are not shown in FIG. 2 through FIG. 4A including data line $270_3$ (and associated signal $BL_3$) and memory cell strings coupled to data line $270_3$.

As shown in FIG. 4C, dielectric structure 451 can include materials 451L and 451P formed in the slit (not labeled) between blocks BLK0 and BLK1. Material 451L can include a dielectric material (e.g., silicon dioxide). Material 451P can include polysilicon.

Data lines $270_0$, $270_1$, $270_2$, and $270_3$ can be located over (in the Z-direction) and extend across (in the X-direction) the blocks (e.g., blocks BLK0 and BLK1) of memory device 200. Each of data lines $270_0$, $270_1$, $270_2$, and $270_3$ can be electrically coupled to respective pillars 450 of blocks BLK0 and BLK1. A portion of memory device 200 along line 4A-4A is shown in FIG. 4A.

Figure 5:
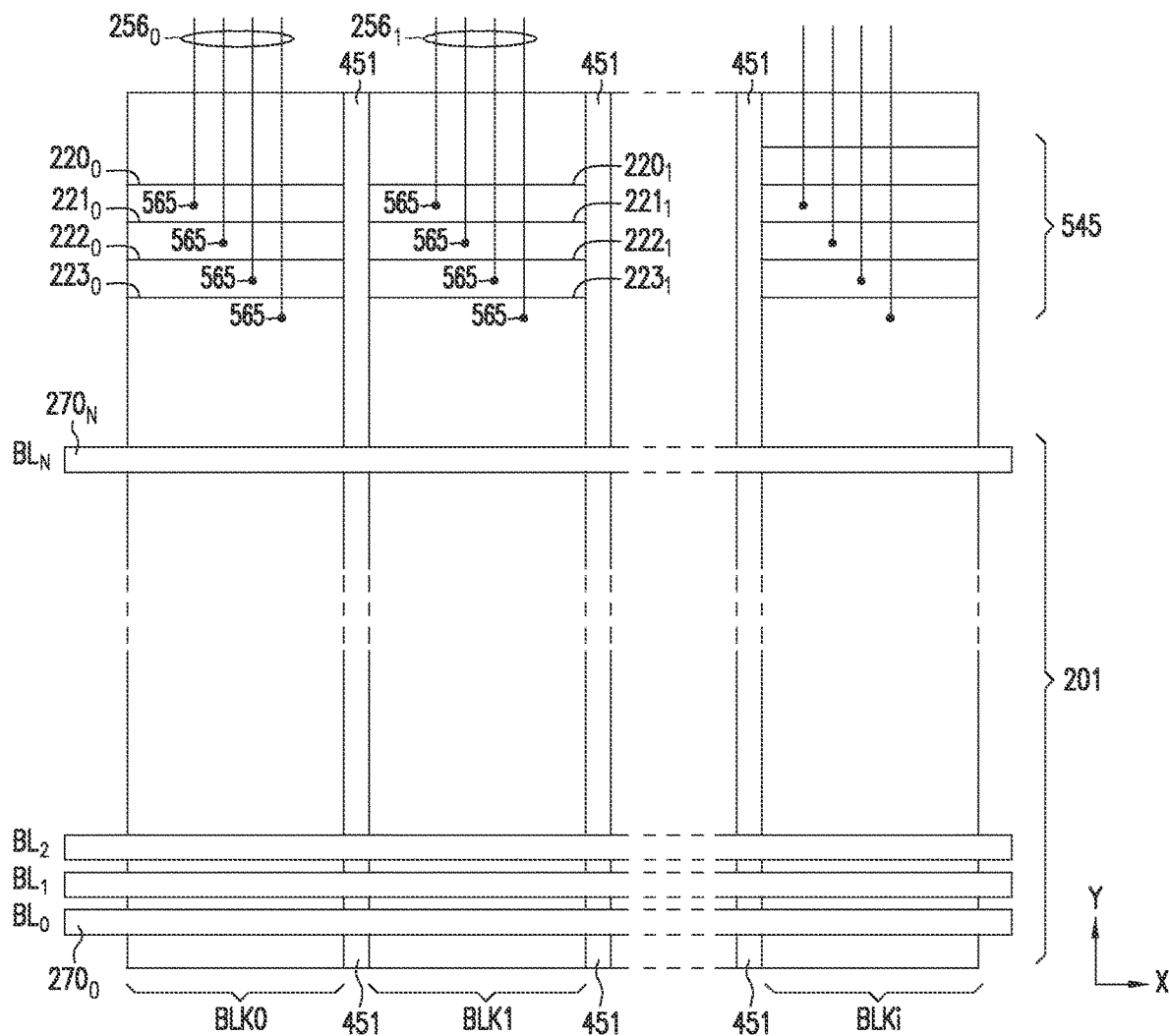
FIG. 5 shows a top view of the memory device of FIG. 4A including a memory array, a staircase region, the dielectric structures, and the blocks BLK0 of the memory device, according to some embodiments described herein.

FIG. 5 shows a top view in the X-Y direction of memory device 200 of FIG. 4A including memory array 201, a region (e.g., staircase region) 545, dielectric structures 451, and blocks BLK0 and BLK1 through BLKi, according to some embodiments described herein. For simplicity, FIG. 5 omits some of the elements (e.g., memory cell strings and associated pillars 450 of memory array 201) of memory device 200 of FIG. 4A. Further, FIG. 5 omits labels for similar or the same elements among the blocks (e.g., block BLK0, BLK1, and BLKi) and the description of such elements is not repeated.

As shown in FIG. 5, blocks BLK0 and BLK1 through BLKi of memory device 200 can be located side-by-side in the X-direction. As shown in FIG. 5, adjacent blocks can be electrically separated from each other by dielectric structure 451 between the adjacent blocks. Each dielectric structure 451 can have a length in the Y-direction, a width in the X-direction, and a depth (e.g., height) in the Z-direction (shown in FIG. 4A). Data lines $270_0$ through $270_N$ can have respective lengths extending in the X-direction across blocks BLK0 through BLKi.

Region 545 (e.g., staircase region) of memory device 200 can be a region where conductive contacts 565 can be formed to electrically couple control gates of respective blocks to respective conductive paths (e.g., conductive paths $256_0$ and $256_1$) of memory device 200. Each of conductive paths $256_0$ can $256_1$ can include a conductive line (e.g., metal line).

As shown in FIG. 5, control gates $220_0$, $221_0$, $222_0$, and $223_0$ of block BLK0 can be coupled to respective conductive path $256_0$ through respective conductive contacts 565 at region 545 of block BLK0. Control gates $220_1$, $221_1$, $222_1$, and $223_1$ of block BLK1 can be coupled to respective conductive path $256_1$ through conductive contacts 565 at region 545 of block BLK1.

Some or all of the structure of memory device 200 shown in FIG. 2 through FIG. 5 can be formed using processes associated with the processes described below with reference to FIG. 6A and FIG. 6B through FIG. 16A and FIG. 16B.

FIG. 6A and FIG. 6B through FIG. 17A and FIG. 17B show different views of elements during processes of forming a memory device 600, according to some embodiments described herein. FIG. 6A shows a side view (e.g., cross-section) in the X-direction of device 600 after dielectric materials (levels of dielectric materials) 621 and dielectric materials (levels of dielectric materials) 622 are alternatively formed over a substrate 699. Substrate 699 is similar to (e.g., can correspond to) substrate 499 (FIG. 4A) of memory device 200. Dielectric materials 621 and 622 can be sequentially formed one material after another over substrate 699 in an interleaved fashion, such that dielectric materials 621 can be interleaved with dielectric materials 622.

FIG. 6B shows a top view of a portion (e.g., in the X-Y plane) of memory device 200 taken along line 6B-6B of FIG. 6A. The side view (in the X-Z direction) of memory device 600 shown in FIG. 6A is taken along line (e.g., cross-section line) 6A-6A of FIG. 6B.

As shown in FIG. 6A, the process of forming memory device 600 can include forming a material 690 over substrate 699. Material 690 can form part of a source (e.g., associated with signal SRC) that is similar to source 290 of FIG. 4A.

One skilled in the art would readily recognize that the process of forming memory device 600 described herein with reference to FIG. 6A and FIG. 6B through FIG. 17A and FIG. 17B can include forming additional elements (not shown) in portions 691 and 692 (shown in dashed lines) of memory device 200 in FIG. 6A. For example, the additional elements in portion 691 can include select circuits similar to select circuit (e.g., source select circuit) 241'a, 244'a, 241'b, and 244'b and other elements of memory device 200 (FIG. 2, FIG. 3, and FIG. 4A). In another example, the additional elements in portion 692 can include select circuits similar to select circuit (e.g., drain select circuit) 241a, 244a, 241b, and 244b and other elements of memory device 200 (FIG. 2, FIG. 3, and FIG. 4A). For simplicity and not to obscure the embodiments described herein, description of formation of such additional elements in portions 691 and 692 is omitted from the description herein.

In the following description, different views of memory device 600 in subsequent processes are based on the views of memory device 600 of FIG. 6A and FIG. 6B and follow the same arrangement of the views (e.g., side view and top view) of FIG. 6A and FIG. 6B. For example, FIG. 7A shows a side view of a portion of memory device 600 taken along line (e.g., cross-section line) 7A-7A of FIG. 7B. FIG. 7B shows a top view of a portion of memory device 600 of FIG. 7A taken along line 7B-7B of FIG. 7A. For simplicity, the following description omits repeating specific views (e.g., side view and top view) and specific cross-section lines of portion of memory device 600 from one process to the next.

In the description herein, elements given the same numerical labels are similar or the same elements. For example, pillar 450 (FIG. 4A) and pillar 450' (FIG. 8A) are similar or the same elements. In another example, control gates $220_0$, $221_0$, $222_0$, and $223_0$ (FIG. 4A) and control gates $220'_0$, $221'_0$, $222'_0$, and $223'_0$ (FIG. 16A) are similar or the same elements. In another example, control gates $220_1$, $221_1$, $222_1$, and $223_1$ (FIG. 4A) and control gates $220'_1$, $221'_1$, $222'_1$, and $223'_1$ (FIG. 16A) are similar or the same elements. Thus, for simplicity, the detailed description of similar or the same elements may not be repeated.

FIG. 7A and FIG. 7B show different views of memory device 600 after openings (e.g., holes) 750 are formed through dielectric materials 621 and 622. Forming openings 750 can include removing (e.g., etching) a portion of dielectric materials 621 and 622 at the locations of openings 750.

FIG. 8A and FIG. 8B show different views of memory device 600 after pillars 450' are formed. Forming pillars 450' can include forming a structure 430' and a dielectric material 405' in respective openings 750. Pillars 450' are similar to (e.g., can correspond to) pillars 450 of FIG. 4A. Structure 430' and dielectric material 405' are similar to (e.g., can correspond to) structure 430 and dielectric material 405, respectively, of FIG. 4A. Like structure 430 of FIG. 4A, structure 430' in FIG. 8A can form part of memory cells (e.g., like memory cells 210, 211 212, and 213 of FIG. 4A) of a respective memory cell string of memory device 600 of FIG. 8A. Pillars 450' of respective strings 234'a, 231'b, and 234'b of memory device 600 shown in FIG. 8A and FIG. 8B are similar to (e.g., can correspond to) pillars 450 of memory cell strings 231a, 234b, and 234b, respectively, of memory device 200 of FIG. 4A and FIG. 4C. For simplicity, structure 430' of each pillar 450' in FIG. 8B is shown in dashed line.

In FIG. 8A, a level (e.g., a layer) of dielectric material 622 (or alternatively, two adjacent levels that include a level of dielectric material 621 and a level of dielectric material 622) can be called a tier of memory device 200. As shown in FIG. 8A, the tiers of memory device 800 can be located (e.g., stacked) one over another in the Z-direction over substrate 699, such that two adjacent tiers can be separated from each other by a respective level (e.g., layer) of dielectric material (e.g., silicon dioxide) 621. FIG. 8A shows an example of a specific number of tiers (e.g., four tiers). However, memory device 200 can include up to (or more than) a hundred tiers.

Figure 9B:
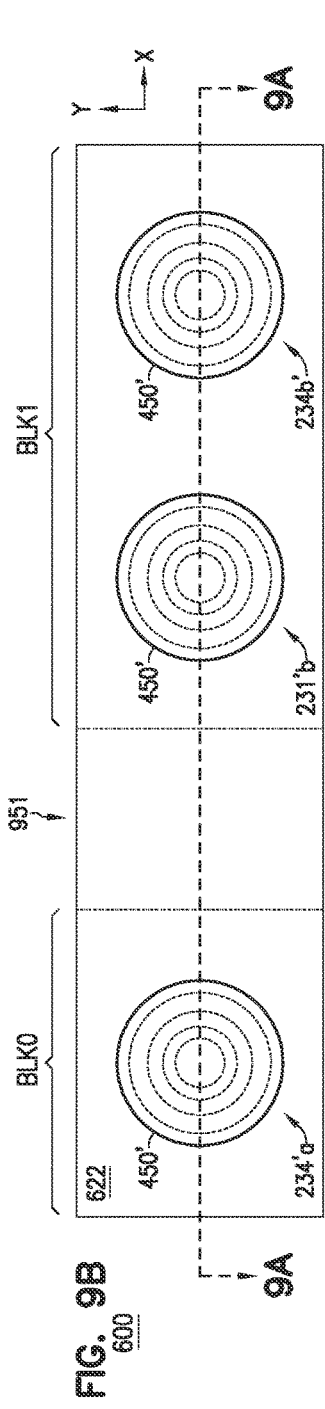
Figure 9A:
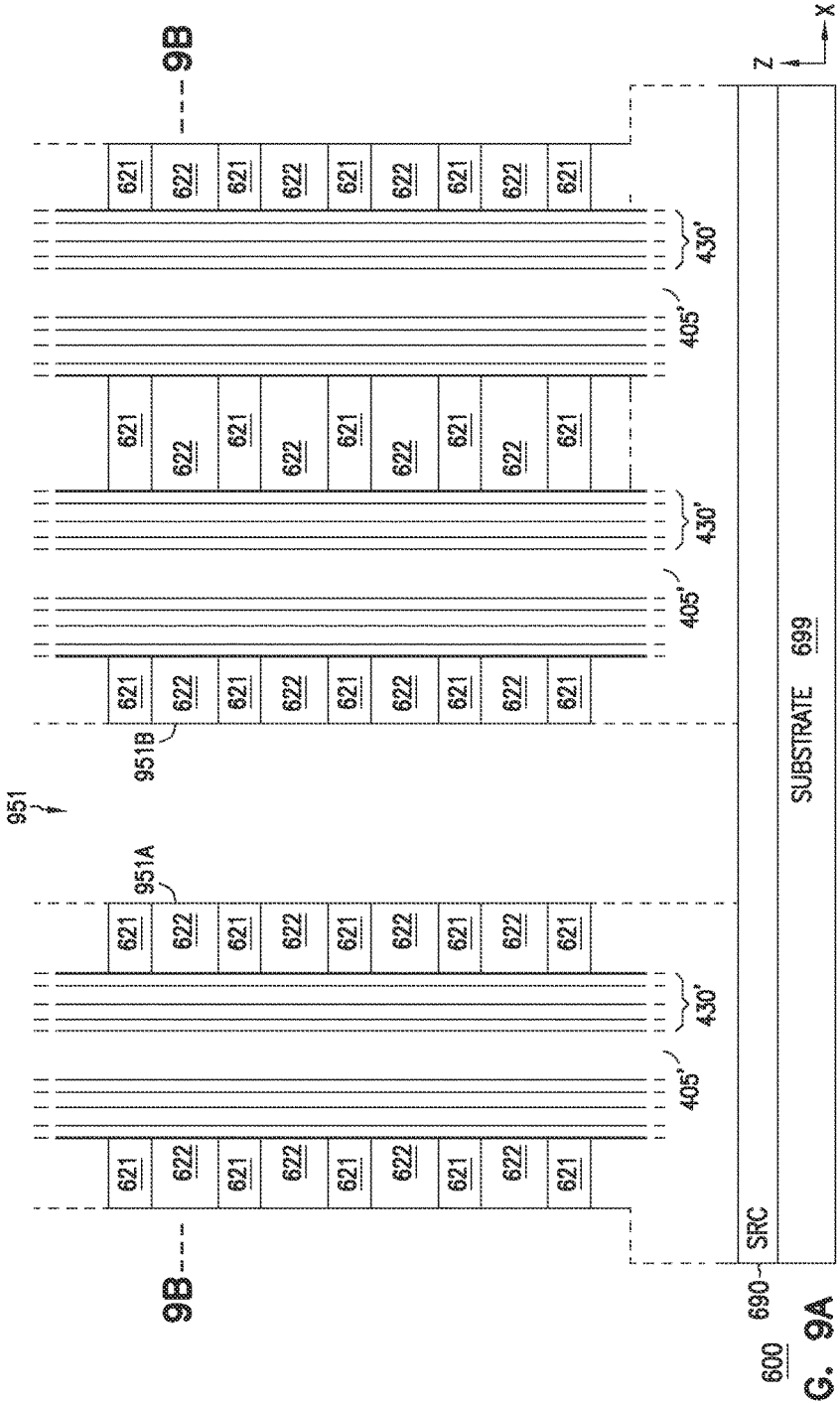

FIG. 9A and FIG. 9B show memory device 600 after a slit (e.g., an opening, a trench, or a cut) 951 is formed. Slit 951 can be formed such that it can extend through the levels of dielectric materials 621 and 622. Slit 951 can include sidewalls 951A and 951B opposite from each other in the X-direction. As shown in FIG. 9A, sidewalls 915A and 915B are vertical sidewalls that can include respective portions of dielectric materials 621 and 622 exposed at slit 951.

Slit 951 can be formed to divide (e.g., separate) elements (e.g., respective memory cell strings and other elements) of memory device 600 into portions that can become part of respective blocks (e.g., blocks BLK0 and BLK1) of memory device 600. For example, slit 951 can separate dielectric materials 621 and 622 into respective portions in blocks BLK0 and BLK1. In another example, slit 951 can separate pillars 450' of respective memory cell strings of memory device 600 into respective portions in blocks BLK0 and BLK1. As shown in FIG. 9A and FIG. 9B, pillar 450' of memory cell string 234'a can be part of block BLK0. Pillars 450' of memory cell strings 231'b and 234'b can be part of block BLK1.

The following descriptions (associated with FIG. 10A and FIG. 10B through FIG. 17A and FIG. 17B involve processes that include removing and then replacing the levels of dielectric materials (e.g., silicon nitride) 622 with respective levels of materials to form control gates in respective tiers in memory device 600.

Figure 10B:
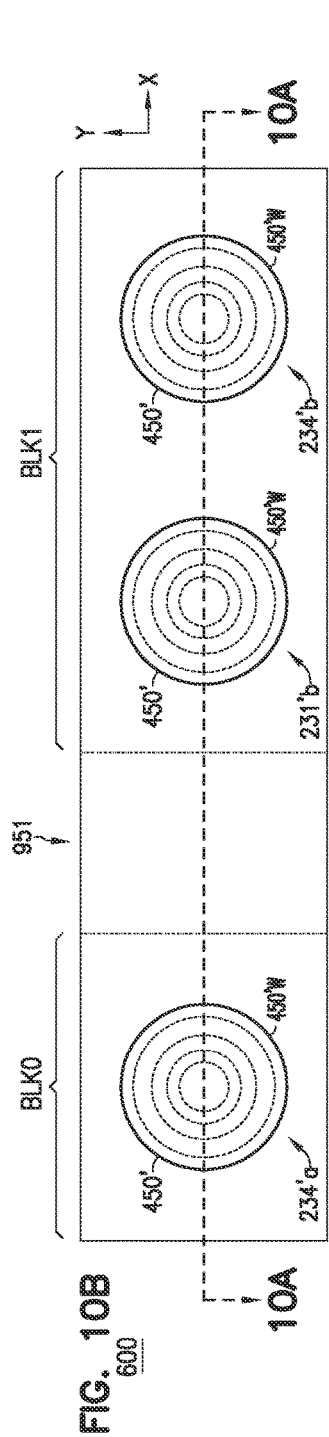
Figure 10A:
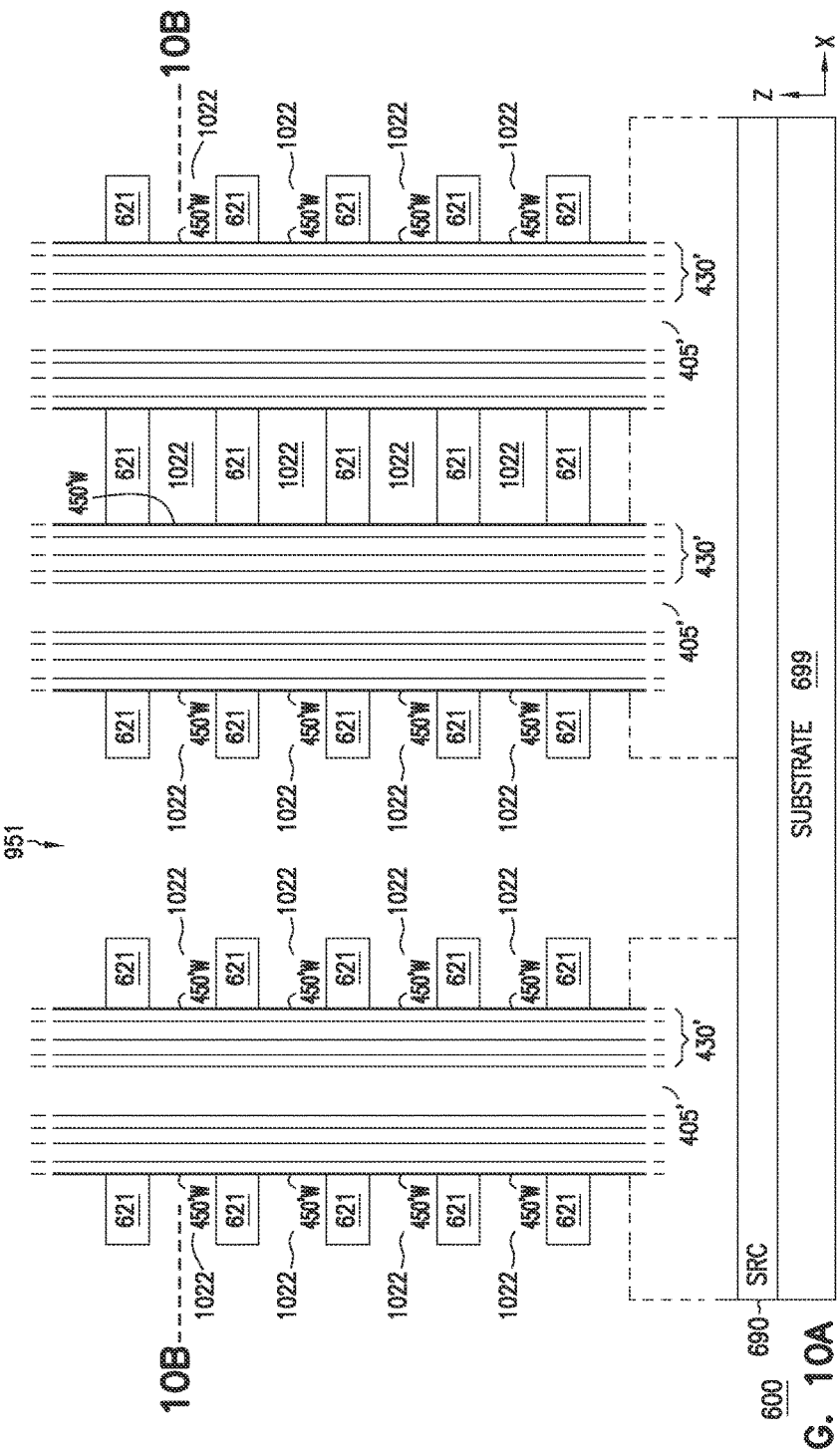

FIG. 10A and FIG. 10B show memory device 600 after dielectric materials 622 are removed (e.g., exhumed) from locations 1022. Locations 1022 in FIG. 10A are voids (empty spaces) that were occupied by dielectric materials 622 in FIG. 9A. In subsequent processes, materials can be formed in locations 1022 to form respective control gates of memory device 600. As shown in FIG. 10A, each pillar 450 can include portions 450'W exposed at respective locations 1022. Each portion 450'W can be part of a vertical sidewall of a respective pillar 450. As shown in FIG. 10A, each portion 450'W can extend in the Z-direction between two adjacent levels of dielectric materials 621 that are also exposed at a respective location 1022.

FIG. 11A and FIG. 11B show memory device 600 after a dielectric material 1152 is formed. Dielectric material 1152 can be similar to or the same as dielectric material 452 of memory device 200 of FIG. 4A. For example, dielectric material 1152 can include a high-k dielectric material (e.g., AlOx, TiSiN, HfSiOx, HfOx, or other high-k dielectric materials). Dielectric material 1152 can have a thickness in a range from 2 nm to 5 nm. Alternatively, dielectric material 1152 can have a thickness greater than 5 nm.

As shown in FIG. 11A, dielectric material 1152 can be a relatively thin layer (e.g., thin film) that can coat (e.g., can be conformal to) portions (e.g., sidewalls) 450'W of pillars 450' and portions of dielectric material 621 that are exposed at locations 1022. Dielectric material 1152 can also be formed on portions (e.g., vertical sidewalls, not labeled) of dielectric material 621 that are exposed at slit 951.

FIG. 12A and FIG. 12B show memory device 600 after a material 1255 is formed. Material 1255 can be formed directly on (e.g., coat) dielectric material 1152, such that material 1255 can be conformal to material 1152. Material 1255 can have a thickness in a range from 2 nm to 5 nm. Alternatively, material 1155 can have a thickness greater than 5 nm.

Material 1255 is similar to (e.g., can correspond to) material 455 of memory device 200 described above with reference to FIG. 4B. Thus, material 1255 can contain titanium (titanium-containing material). For example, material 1255 can include titanium silicon nitride (TiSiN). In another example, material 1255 can include titanium nitride (TiN).

The following processes associated with description with FIG. 13A, FIG. 13B, FIG. 14A, FIG. 14B, FIG. 15A, and FIG. 15B describe forming different portions of the tungsten structures of respective control gates in respective tiers in memory device 600. The processes include examples for forming a material 1353 (e.g., a silicon-containing material) in FIG. 13A and FIG. 13B through processes facilitating desirable step coverage, such as atomic layer deposition (ALD) or chemical vapor deposition (CVD). Material 1353 (e.g., silicon-containing material) is then subsequently converted to a material 1453 (e.g., a tungsten seed material having predominance of beta-phase tungsten) in FIG. 14A and FIG. 14B. As described below, material 1353 (e.g., silicon-containing material in FIG. 13A and FIG. 13B) will preferably include a dopant that will be present in the converted tungsten seed material (e.g., material 1453 in FIG. 14A and FIG. 14B). The dopant in material 1353 is selected to inhibit nucleation in a material 1554 (e.g., a subsequently deposited tungsten fill material having predominance of alpha-phase tungsten) in FIG. 15A and FIG. 15B that is formed on material 1453 (e.g., the tungsten seed material having predominance of beta-phase tungsten).

FIG. 13A and FIG. 13B show memory device 600 after a material 1353 is formed. Material 1353 can be formed directly on (e.g., coat) dielectric material 1255, such that material 1353 can be conformal to material 1255. As discussed above, material 1353 is a silicon-containing material. Material 1353 can include silicon (e.g., polysilicon) and a suitable dopant. The dopant may be, for example, anyone or more of chlorine, arsenic, and phosphorus. The dopant in material (e.g., silicon-containing material) 1353 is selected to promote formation of a predominance of beta-phase tungsten in material (e.g., tungsten seed material) 1453 in FIG. 14A and FIG. 14B (described below) that is formed from material 1353.

In some examples, material 1353 (silicon-containing material) in FIG. 13A and FIG. 13B can be deposited in a manner to also deposit the dopant within material 1353. In other examples, silicon may first be deposited, and subsequently doped with a dopant. An atomic layer deposition (ALD) or a chemical vapor deposition (CVD) process may be used to deposit material 1353 (with or without the dopant). The CVD deposition may be performed as a single stage deposition or as a multiple stage deposition (as with the ALD deposition), as known to persons skilled in the art.

In a process in which material 1353 (FIG. 13A and FIG. 13B) is deposited as a doped material, CVD deposition of a doped silicon material may be performed by providing multiple precursors, of which at least one includes the dopant. For example, CVD deposition of chlorine-doped silicon may be performed through use of precursors including disilane ($Si_2H_6$) and dichlorosilane ($H_2Cl_2Si$). In some examples, the precursors may be alternated through a limited number of cycles (for example, five cycles or fewer, and in some cases just two cycles). As example process conditions for such CVD or ALD deposition, the deposition may be performed at a temperature range within 300 to 500 degrees centigrade, and at pressures ranging from In Torr to 10 Torr. In some examples, the precursors may be supplied in amounts to provide chlorine dopant at a level within the range of 0.001% to 10%. In some examples, a dopant concentration within the range of about 0.05% to about 2% may be satisfactory; with a dopant concentration within the range of 0.1 to about 0.5% commonly appropriate; for example, about 0.02% (or about ~1E20 atoms/$cm^3$), in some implementations may be appropriate.

For many examples, the doped silicon may be deposited, such that material 1353 (FIG. 13A and FIG. 13B) can be formed to a thickness from 2 nm to 5 nm. As discussed above, the dopant in material 1353 is selected to promote the forming of beta-phase tungsten in material (e.g., a tungsten seed material) 1453 in FIG. 14A and FIG. 14B (described below).

In a process in which material 1353 (FIG. 13A and FIG. 13B) is formed by first depositing silicon and subsequently doping the silicon may be deposited through use of a disilane precursor ($Si_2H_6$). In other examples, as an alternative, the precursor may include silane ($SiH_4$), or potentially other silicon-containing precursors. In many examples, the silicon may be deposited to have a thickness from 2 nm to 5 nm. Subsequently, the deposited silicon may be doped with a suitable dopant, which may be, for example, any one or more of chlorine, arsenic, and phosphorus. Doping levels for chlorine were discussed above. In some examples, arsenic and phosphorus may be doped, for example, at doping levels within the ranges as described above for chlorine.

In many applications, the thickness of the deposited silicon in material 1353 (FIG. 13A and FIG. 13B) is limited to thicknesses (e.g., 2 nm to 5 nm) as discussed above, because the silicon in material 1353 will be reduced to beta-phase tungsten (included in material 1453 in FIG. 14A and FIG. 14B, described below). Beta-phase tungsten is desirable for reducing nucleation of a subsequently deposited alpha-phase tungsten (included in material 1554 in FIG. 15A and FIG. 15B, described below). However, beta-phase tungsten has substantially higher resistivity (for example, in some implementations, approximately 3 to 10 times greater resistivity) than that of alpha-phase tungsten. As a result, relatively higher ratios of the volume of alpha-phase tungsten (in material 1554) to beta-phase tungsten (in material 1453) result in tungsten structures with lower resistivity. Thus, reducing the dimensions of beta-phase tungsten in the tungsten seed material (in material 1453) as much as possible (in view of competing factors of process complexity, costs, etc.), while maintaining the nucleation-inhibiting property of the tungsten seed material is advantageous.

Material 1453 having a majority composition of beta-phase tungsten promotes the forming of a predominance of relatively large-grained alpha-phase tungsten in a subsequently formed material 1454 (FIG. 14A and FIG. 14B, described below) formed on material 1453 (material having a majority composition of beta-phase tungsten). As discussed above, relatively large-grained alpha-phase tungsten can reduce the resistance of the tungsten structure of the control gates of the memory device, thereby reducing the resistance of the control gates.

FIG. 14A and FIG. 14B show memory device 600 after material (e.g., tungsten seed material) 1453 is formed. As discussed above, material 1453 can be formed by converting material (e.g., silicon-containing material) 1353 into material (e.g., beta-phase tungsten) 1453. In FIG. 14A and FIG. 14B, since material 1453 can be formed from material 1353 (FIG. 13A and FIG. 13B) and material 1353 can be formed directly on (can interface with) dielectric material 1255, material 1453 (FIG. 14A and FIG. 14B) can also be formed directly on (can interface with) material 1255.

As described above, material 1453 (which has predominantly beta-phase tungsten seed material) including the material of the dopant is configured to inhibit nucleation when material (e.g., a subsequent tungsten fill material) 1554 in FIG. 15A and FIG. 15B is performed on material 1453, and thus promotes formation of material 1554 that is predominantly alpha-phase tungsten (i.e., greater than 50 percent by volume), and further promotes formation of relatively larger grains in the alpha-phase tungsten in material 1554. While not wishing to be bound by theory, it appears that the nucleation inhibition of the beta-phase tungsten (in material 1453) leads to sparse nucleation of alpha-phase tungsten (in material 1554) on the beta-phase tungsten, therefore allowing the alpha-phase grains (in material 1554) to "bloom" to larger sizes than those obtained through conventional deposition processes.

Material 1453 (FIG. 14A and FIG. 14B) can be performed by exposure of material 1353 (FIG. 13A and FIG. 13B) to tungsten hexafluoride ($WF_6$), typically in the presence of hydrogen ($H_2$), under suitable conditions. For example, for material (e.g., silicon-containing material) 1353 of 2 nm to 5 nm thick, exposure of material 1353 to $WF_6$ at (in some examples) between 30 and 50 Torr, for example about 40 Torr, at between about 350° C. and 425° C. (for example about 395° C.), with a ratio of $WF_6$ to $H_2$ of 0.0001 to 100.0 for about 20 to 30 seconds can be satisfactory. This process conditions may be implemented to result in essentially all silicon in material 1353 (FIG. 13A and FIG. 13B) being reduced to tungsten in material 1453 (FIG. 14A and FIG. 14B).

FIG. 15A and FIG. 15B show memory device 600 after material (e.g., tungsten fill material) 1554 is formed. Material 1554 can be formed on material 1453 and can occupy (e.g., fill) the rest of the voids at locations 1022 and slit 951. Material 1554 can be formed by ALD process or CVD process. For example, forming material 1554 can include growing tungsten on material 1453 until the tungsten (material 1554) fills the voids at locations 1022 and slit 951. Alternatively, forming material 1554 can include depositing additional tungsten (material 1554) on initial tungsten of material 1453 until the tungsten (material 1554) fills the voids at locations 1022 and slit 951.

The CVD process used to form (e.g., depositing) material (e.g., tungsten fill material) 1554 may use tungsten hexafluoride ($WF_6$); and may be run at a temperature of 200-500° C. or more specifically between about 375° C. and 425° C., or about 395° C. The CVD process may use a high-power long-throw plasma of about 4-40 kW for about 10-100 s. The chamber pressure for bulk CVD deposition of tungsten to increase the tungsten grain size of material 1554 may be in a range, for example, of about 30 Torr and about 50 Torr, for example 40 Torr, though higher or lower pressures may also be used.

The CVD process to form (e.g., depositing) material (e.g., tungsten fill material) 1554 may alternatively comprise a variety of processes such as diborane ($B_2H_6$) based nucleation and/or silane ($SiH_4$) based nucleation, for example. In such an example, the CVD process may include bulk deposition or pulsed nucleation. A diborane ($B_2H_6$) nucleation cycle for the CVD deposition process includes a diborane ($B_2H_6$) soak, tungsten fluoride ($WF_6$) dose followed by $B_2H_6/WF_6$ pulses. Such a nucleation cycle may be repeated in a range of 1 to 20 times or between 1 and 4 times. Conditions for a silane ($SiH_4$) based nucleation cycle for the CVD tungsten process includes a silane ($SiH_4$) soak, tungsten fluoride ($WF_6$) dose followed by $SiH_4/WF_6$ pulses. This nucleation cycle may be repeated in a range of 1 to 20 times or more particularly between 3 and 5 times. In some examples, a diborane or silane nucleation temperature range may be between about 250° C. and 350° C., with the chamber temperature and pressure ranges mirroring the above.

Thus, the processes associated with FIG. 13A, FIG. 13B, FIG. 14A, FIG. 14B, FIG. 15A, and FIG. 15B can include forming material 1353 (e.g., silicon-containing material) in FIG. 13A and FIG. 13B; converting material 1353 into material 1453 (e.g., beta-phase tungsten seed material (initial tungsten material)) in FIG. 14A and FIG. 14B; then forming material 1554 (e.g., alpha-phase tungsten fill material (additional tungsten material)) on material 1453.

Material 1453 is similar to (e.g., can correspond to) material 453 of memory device 200 described above with reference to FIG. 4B. Thus, like the tungsten structure formed by material 453, material 1453 as described above can form a tungsten structure that exhibits a property (e.g., characteristics) of beta-phase tungsten in which a majority (e.g., greater than 50 percent by volume) of tungsten in material 1453 is beta-phase tungsten.

Material 1554 is similar to (e.g., can correspond to) material 454 of memory device 200 described above with reference to FIG. 4B. Thus, like the tungsten structure formed by material 454, material 1554 as described above can have a resistance similar to (or the same as) the resistance of material 454 (described above). Material 1554 also has tungsten in which a majority (e.g., greater than 50 percent by volume) of the tungsten in material 1554 is alpha-phase tungsten. The grain size of the alpha-phase tungsten of material 1554 can also be similar to (or the same as) the grain size of the alpha-phase tungsten of material 454. For example, a majority (e.g., at least 50%) of the tungsten in material 1554 has a maximum dimension of at least 50 nm (or at least about 50 nm). In another example, a majority (e.g., at least 50%) of the tungsten in material 1554 has a maximum dimension of at least 80 nm (or at least about 80 nm). In another example, a majority (e.g., at least 50%) of the tungsten in material 1554 has a maximum dimension of at least 100 nm (or at least about 100 nm).

As described above with reference to FIG. 13A, FIG. 13B, FIG. 14A, FIG. 14B, FIG. 15A, and FIG. 15B, material (e.g., beta-phase tungsten) 1453 is formed on material (e.g., high-k dielectric material) 1255, then material (e.g., alpha-phase tungsten) 1554 is formed on material 1453. Since material 1453 includes beta-phase tungsten, nucleation of alpha-phase tungsten (which is included in material 1554) on beta-phase tungsten can lead to a relatively larger grain size (having relative grain sizes (e.g., at least 50 nm) as described above) in the tungsten structure of the control gates of memory device 600. As an example, the grain size of material 1554 forming with material 1453 can be relatively larger (e.g., at least two times larger) than the grain size of material 1554 using the alternative process. The larger grain size can reduce the relative resistance of the control gates of memory device 600, thereby improving operations (e.g., read, write, and erase operations) of memory device 600.

FIG. 16A and FIG. 16B show memory device 600 after formation of control gates $220'_0$, $221'_0$, $222'_0$, and $223'_0$ (in block BLK0) and control gates $220'_1$, $221'_1$, $222'_1$, and $223'_1$ (in block BLK1). Control gates $220'_0$, $221'_0$, $222'_0$, and $223'_0$ in block BLK0, and control gates $220'_1$, $221'_1$, $222'_1$, and $223'_1$ in block BLK1 are similar to (e.g., can correspond to) control gates $220_0$, $221_0$, $222_0$, and $223_0$ in block BLK0, and control gates $220$, $221_1$, $222_1$, and $223_1$ in block BLK1, respectively, of memory device 200 of FIG. 4A.

Forming control gates $220'_0$, $221'_0$, $222'_0$, and $223'_0$ (in block BLK0) and control gates $220'_1$, $221'_1$, $222'_1$, and $223'_1$ (in block BLK1) can include removing (e.g., by etching or cutting) a portion of material 1554 at slit 951, such that remaining portions of material 1554 at different levels (e.g., tiers) of memory device 600 are electrically separated from each other. As shown in FIG. 16A, control gates $220'_0$, $221'_0$, $222'_0$, and $223'_0$ (in block BLK0) and control gates $220'_1$, $221'_1$, $222'_1$, and $223'_1$ (in block BLK1) are remaining portions of material 1554 at respective levels of memory device 600.

FIG. 17A and FIG. 17B show memory device 600 after dielectric structure 451' is formed in slit 951 (labeled in FIG. 15A). Forming dielectric structure 451' can include forming a material (e.g., a liner) 451'L in slit 951 (e.g., on sidewalls of slit 951) and then forming a material (e.g., polysilicon) 451'P between materials 451'L. Dielectric structure 451' and materials 451'L and 451'P are similar to (e.g., can correspond to) dielectric structure 451 and materials 451L and 451P, respectively, of memory device 200 described above with reference to FIG. 4A and FIG. 4C.

As shown in FIG. 17A, dielectric structure 451' can electrically separate material 1554 into respective portions in blocks BLK0 and BLK1 that form respective control gates $220'_0$, $221'_0$, $222'_0$, and $223'_0$ (in block BLK0) and respective control gates $220'_1$, $221'_1$, $222'_1$, and $223'_1$ (in block BLK0).

The description of forming memory device 600 with reference to FIG. 6A and FIG. 6B through FIG. 17A and FIG. 17B can include other processes to form a complete memory device (e.g., memory device 600). Such processes are omitted from the above description so as not to obscure the subject matter described herein. Memory device 600 can have improvements and benefits (e.g., lower resistance and better performance) similar to that of memory device 200.

The illustrations of apparatuses (e.g., memory devices 100, 200, and 600) and methods (e.g., processes associated with forming memory devices 600 and 1800) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, and 600) or a system (e.g., a computer, a cellular phone, or other electronic systems) that includes a device such as any of memory devices 100, 200, and 600.

Any of the components described above with reference to FIG. 1 through FIG. 17B can be implemented in a number of ways, including simulation via software. Thus, apparatuses, e.g., memory devices 100, 200, and 600, or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, and 600 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 17B include apparatuses, and methods of forming the apparatuses. One of the apparatuses includes a first dielectric material; a second dielectric material separated from the first dielectric material; a memory cell string including a pillar extending through the rust and second dielectric materials, the pillar including a portion between the first and second dielectric materials; an additional dielectric material contacting the portion of the pillar; a conductive material contacting the additional dielectric material; and a tungsten structure including a portion of tungsten contacting the conductive material, wherein a majority of the portion of tungsten is beta-phase tungsten. Other embodiments including additional apparatuses and methods are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a first dielectric material;
a second dielectric material separated from the first dielectric material;
a memory cell string including a pillar extending through the first and second dielectric materials, the pillar including a portion between the first and second dielectric materials;
a control gate associated with the memory cell string;
an additional dielectric material contacting the portion of the pillar;
a conductive material contacting the additional dielectric material; and
a tungsten structure including a portion of tungsten contacting the conductive material, wherein the tungsten structure is part of the control gate, and a majority of the portion of tungsten is beta-phase tungsten, and the tungsten structure includes an additional portion of tungsten contacting the portion of tungsten, and a majority of the additional portion of tungsten is alpha-phase tungsten.

2. The apparatus of claim 1, wherein the additional dielectric material includes aluminum oxide.

3. The apparatus of claim 1, wherein the first and second dielectric materials have a same dielectric material.

4. The apparatus of claim 1, wherein the conductive material contains titanium.

5. The apparatus of claim 1, wherein the conductive material has a thickness in a range from 2 nanometers to 5 nanometers.

6. The apparatus of claim 1, wherein the conductive material has a discontinuous structure.

7. An apparatus comprising:
a first dielectric material;

a second dielectric material separated from the first dielectric material;

a memory cell string including a pillar extending through the first and second dielectric materials, the pillar including a portion between the first and second dielectric materials;

an additional dielectric material contacting the portion of the pillar;

a conductive material contacting the additional dielectric material; and a tungsten structure including a portion of tungsten contacting the conductive material, wherein a majority of the portion of tungsten is beta-phase tungsten, wherein the tungsten structure includes an additional portion of tungsten contacting the portion of tungsten, and a majority of the additional portion of tungsten is alpha-phase tungsten.

8. The apparatus of claim 7, wherein the majority of the second additional portion of tungsten has a grain size having a maximum dimension of at least 80 nanometers.

9. The apparatus of claim 8, wherein at least 50% of the additional portion of tungsten has a grain size with a maximum dimension of at least about 100 nanometers.

10. An apparatus comprising:
a first dielectric material;
a second dielectric material separated from the first dielectric material;
a memory cell string including a pillar extending through the first and second dielectric materials, the pillar including an additional dielectric material between the first and second dielectric materials;
a control gate associated with the memory cell string;
a conductive material contacting the additional dielectric material; and
a tungsten structure including a portion of tungsten contacting the conductive material, wherein the tungsten structure is part of the control gate, and a majority of the portion of tungsten is beta-phase tungsten, and the tungsten structure includes an additional portion of tungsten contacting the portion of tungsten, and a majority of the additional portion of tungsten is alpha-phase tungsten.

11. The apparatus of claim 10, wherein the additional dielectric material includes aluminum oxide.

12. The apparatus of claim 10, wherein the first and second dielectric materials have a same dielectric material.

13. The apparatus of claim 10, wherein the conductive material contains titanium.

14. An apparatus comprising:
a first dielectric material;
a second dielectric material separated from the first dielectric material;
a memory cell string including a pillar extending through the first and second dielectric materials, the pillar including an additional dielectric material between the first and second dielectric materials;
a conductive material contacting the additional dielectric material; and
a tungsten structure including a portion of tungsten contacting the conductive material, wherein a majority of the portion of tungsten is beta-phase tungsten, wherein the tungsten structure includes an additional portion of tungsten contacting the portion of tungsten, and a majority of the additional portion of tungsten is alpha-phase tungsten.

15. The apparatus of claim 14, wherein the majority of the additional portion of tungsten has a grain size having a maximum dimension of at least 50 nanometers.

16. The apparatus of claim 15, wherein at least 50% of the additional portion of tungsten has a grain size with a maximum dimension of at least about 100 nanometers.

17. An apparatus comprising:
a first dielectric material;
a second dielectric material separated from the first dielectric material;
a memory cell string including a pillar extending through the first and second dielectric materials, the pillar including a portion between the first and second dielectric materials;
an additional dielectric material contacting the portion of the pillar, the additional dielectric material having a dielectric constant greater than a dielectric constant of silicon dioxide;
a conductive material contacting the additional dielectric material, the conductive material containing titanium; and
a tungsten structure including a portion of tungsten contacting the conductive material, wherein a majority of the portion of tungsten is beta-phase tungsten wherein the tungsten structure includes an additional portion of tungsten contacting the portion of tungsten, and a majority of the additional portion of tungsten is alpha-phase tungsten.

18. The apparatus of claim 17, wherein the additional dielectric material includes aluminum oxide.

19. The apparatus of claim 17, wherein the first and second dielectric materials have a same dielectric material.

20. The apparatus of claim 17, wherein the conductive material includes titanium silicon nitride.

21. The apparatus of claim 17, wherein the conductive material includes titanium nitride.

22. An apparatus comprising:
control gates for a memory cell string, the control gates interleaved with dielectric materials, the control gates including a control gate located between a first dielectric material of the dielectric materials and a second dielectric material of the dielectric materials;
a pillar of the memory cell string extending through the control gates and the dielectric materials, the pillar including a portion between the first and second dielectric materials;
an additional dielectric material formed on the portion of the pillar, the first dielectric material of the dielectric materials, and the second dielectric material of the dielectric materials, the additional dielectric material having a dielectric constant at least equal to a dielectric constant of aluminum oxide;
a conductive material formed on the additional dielectric material, the conductive material containing titanium; and
a tungsten structure including a portion of tungsten contacting the conductive material, wherein a majority of the portion of tungsten is beta-phase tungsten, wherein the tungsten structure includes an additional portion of tungsten contacting the portion of tungsten, and a majority of the additional portion of tungsten is alpha-phase tungsten.

23. The apparatus of claim 22, wherein the conductive material includes titanium silicon nitride.

24. The apparatus of claim 22, wherein the conductive material includes titanium nitride.

25. The apparatus of claim 22, wherein the first and second dielectric materials have a same dielectric material.

* * * * *